(12) United States Patent
Kogan et al.

(10) Patent No.: US 12,474,633 B2
(45) Date of Patent: Nov. 18, 2025

(54) POD HANDLING SYSTEMS AND METHODS FOR A LITHOGRAPHIC DEVICE

(71) Applicant: ASML Holding N.V., Veldhoven (NL)

(72) Inventors: Boris Kogan, Norwalk, CT (US); Robert Jeffrey Wade, Stamford, CT (US); George Hilary Harrold, Redding, CT (US); Matthew Boudreau, Norwalk, CT (US)

(73) Assignee: ASML HOLDING N.V., Veldhoven (NL)

( * ) Notice: Subject to any disclaimer, the term of this patent is extended or adjusted under 35 U.S.C. 154(b) by 305 days.

(21) Appl. No.: 18/023,985

(22) PCT Filed: Aug. 19, 2021

(86) PCT No.: PCT/EP2021/073095
§ 371 (c)(1),
(2) Date: Feb. 28, 2023

(87) PCT Pub. No.: WO2022/053283
PCT Pub. Date: Mar. 17, 2022

(65) Prior Publication Data
US 2023/0314931 A1    Oct. 5, 2023

Related U.S. Application Data

(60) Provisional application No. 63/076,809, filed on Sep. 10, 2020.

(51) Int. Cl.
*H01L 21/677* (2006.01)
*G03F 1/00* (2012.01)
(Continued)

(52) U.S. Cl.
CPC .......... *G03F 1/06* (2013.01); *H01L 21/67259* (2013.01); *H01L 21/67359* (2013.01);
(Continued)

(58) Field of Classification Search
None
See application file for complete search history.

(56) References Cited

U.S. PATENT DOCUMENTS 6,345,851 B1    2/2002    Friedman
7,372,056 B2    5/2008    Bykanov et al.
(Continued)

FOREIGN PATENT DOCUMENTS

JP    H 11-297786 A    10/1999
JP    2016-163001 A    9/2016
(Continued)

OTHER PUBLICATIONS

International Search Report and Written Opinion of the International Searching Authority directed to International Patent Application No. PCT/EP2021/073095, mailed Dec. 22, 2021; 9 pages.

*Primary Examiner* — Mark C Hageman
(74) *Attorney, Agent, or Firm* — Sterne, Kessler, Goldstein & Fox P.L.L.C.

(57) ABSTRACT

Systems, apparatuses, and methods are provided for transporting a reticle chamber (pod) for processing. In one example, a system for transporting the pod is disclosed. The system may include a moving apparatus, a base coupled to the moving apparatus, and a gripping ring extending from the base. In some aspects, the gripping ring grips a flange extending from the pod. The moving apparatus moves the base in response to the gripping ring gripping the flange.

14 Claims, 12 Drawing Sheets

(51) Int. Cl.
  *H01L 21/67* (2006.01)
  *H01L 21/673* (2006.01)
  *H01L 21/687* (2006.01)

(52) U.S. Cl.
  CPC .... *H01L 21/67379* (2013.01); *H01L 21/6773* (2013.01); *H01L 21/68707* (2013.01)

(56) References Cited

U.S. PATENT DOCUMENTS

| | | | |
|---|---|---|---|
| 7,405,416 B2 | 7/2008 | Algots et al. | |
| 7,872,245 B2 | 1/2011 | Vaschenko et al. | |
| 10,737,397 B2* | 8/2020 | Glatz | B66F 9/18 |
| 11,295,973 B2* | 4/2022 | Wu | H01L 21/67379 |
| 11,569,106 B2* | 1/2023 | Yun | H01L 21/67121 |
| 11,664,255 B2* | 5/2023 | Nirschl | B25J 15/02 |
| | | | 414/281 |
| 2011/0245964 A1 | 10/2011 | Sullivan et al. | |
| 2014/0112741 A1 | 4/2014 | Yoshioka et al. | |
| 2023/0314931 A1* | 10/2023 | Kogan | H01L 21/67379 |
| | | | 206/710 |

FOREIGN PATENT DOCUMENTS

| | | |
|---|---|---|
| KR | 2020-0039227 A | 4/2020 |
| KR | 2020-0050130 A | 5/2020 |
| WO | WO 2019/137846 A1 | 7/2019 |

\* cited by examiner

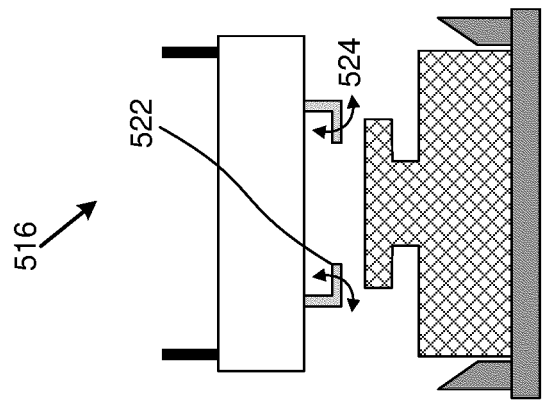
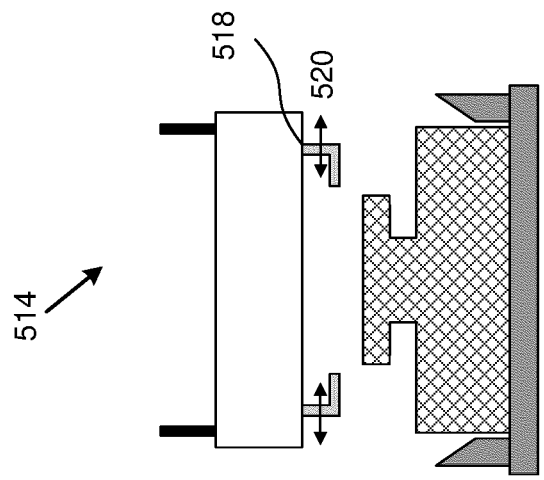
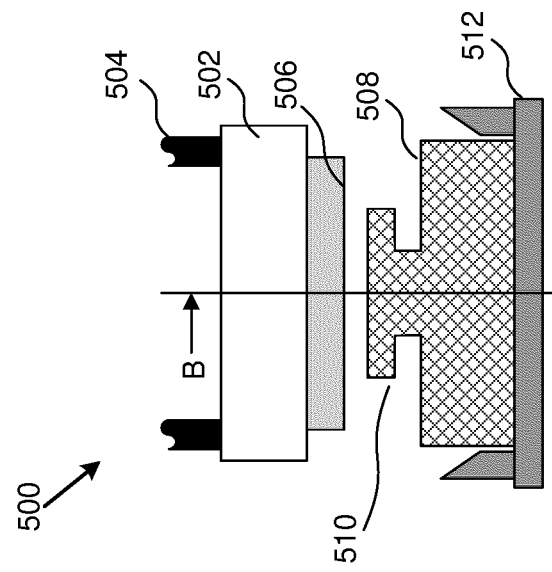

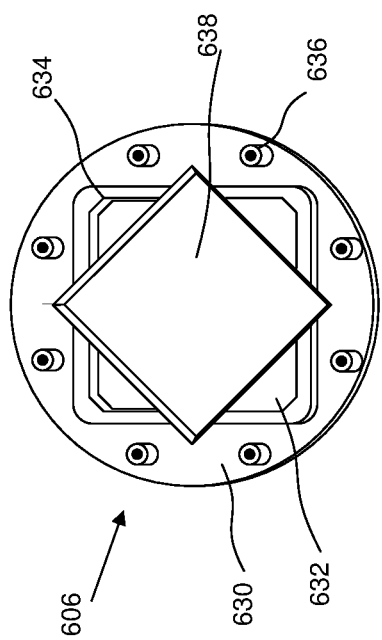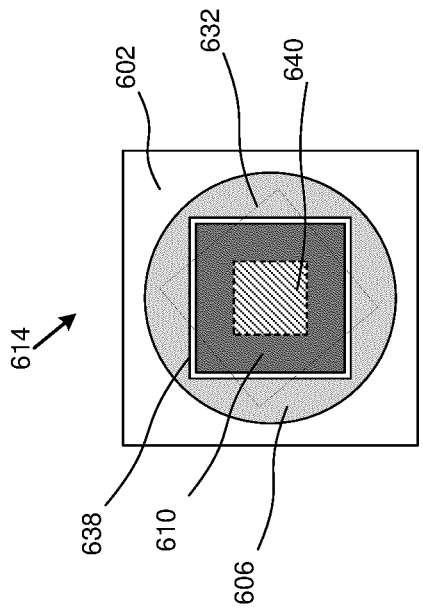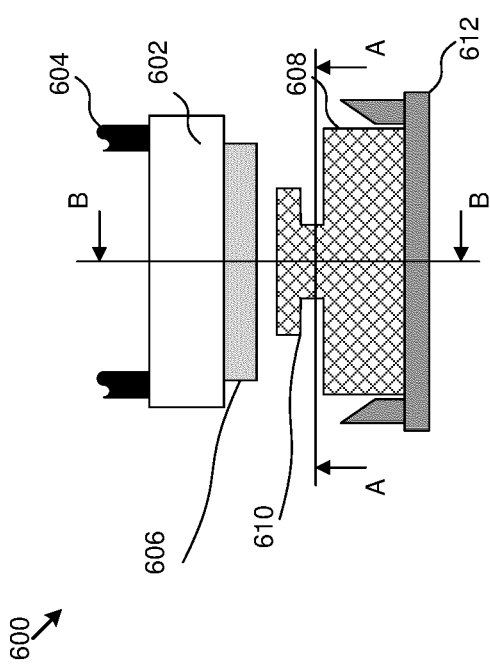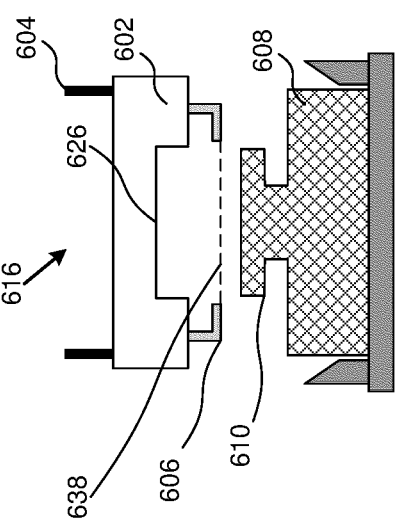
FIG. 6A
FIG. 6B
FIG. 6C
FIG. 6D

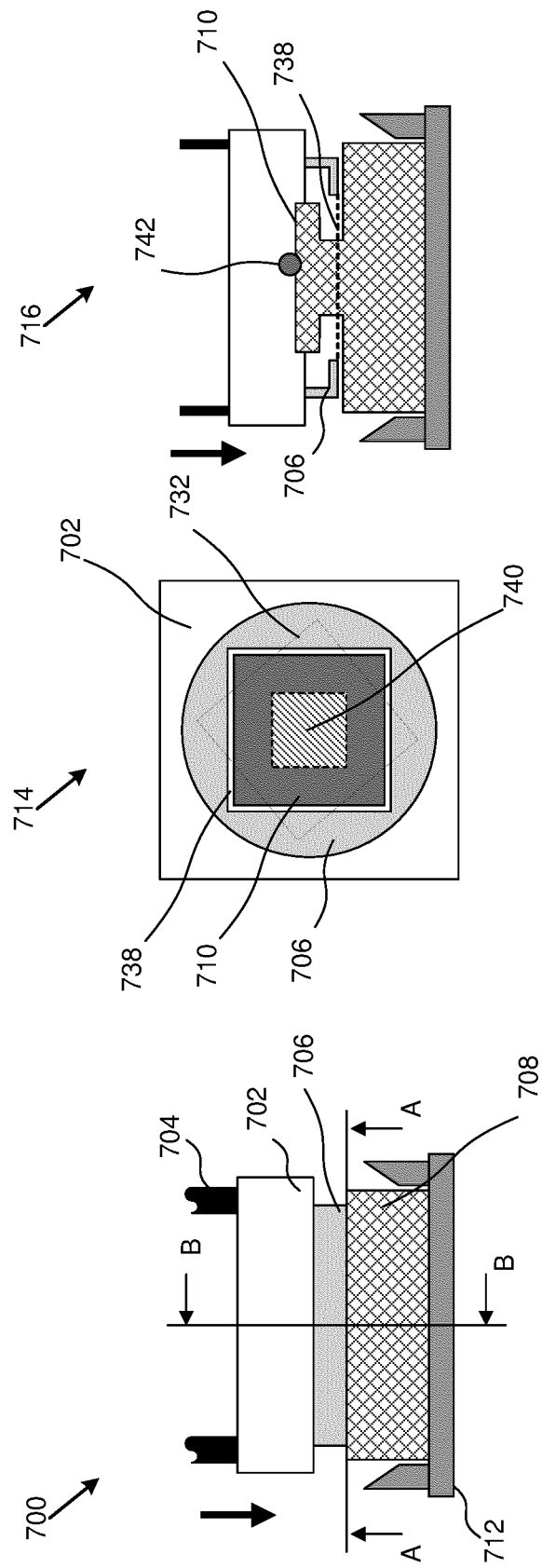

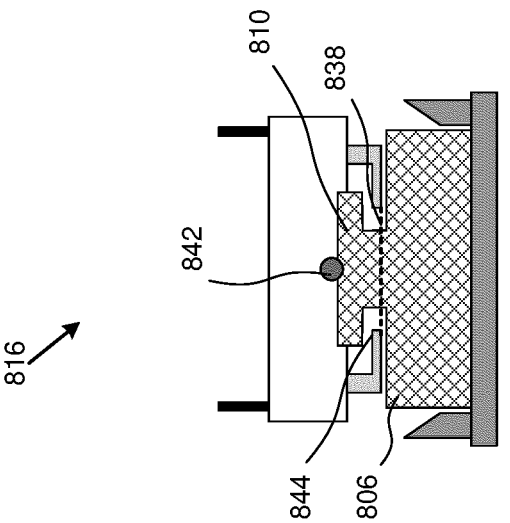
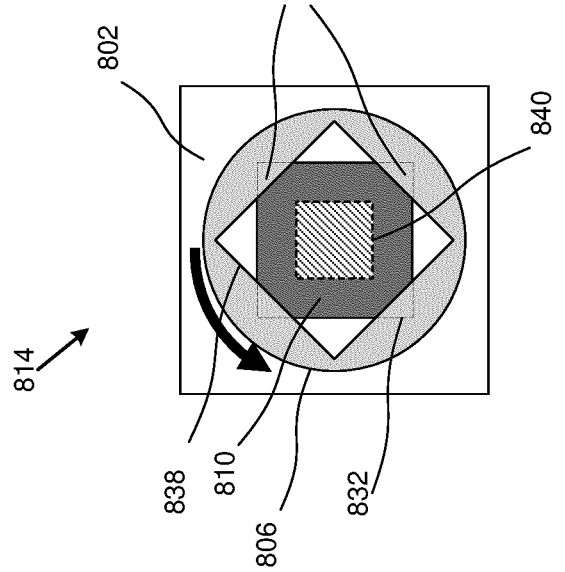
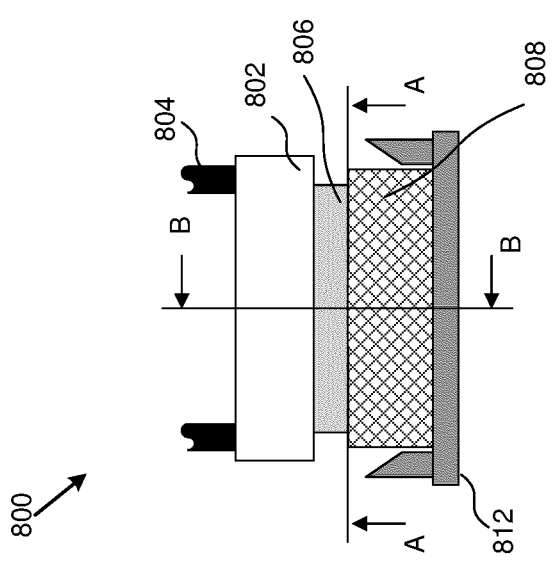
FIG. 8C
FIG. 8B
FIG. 8A

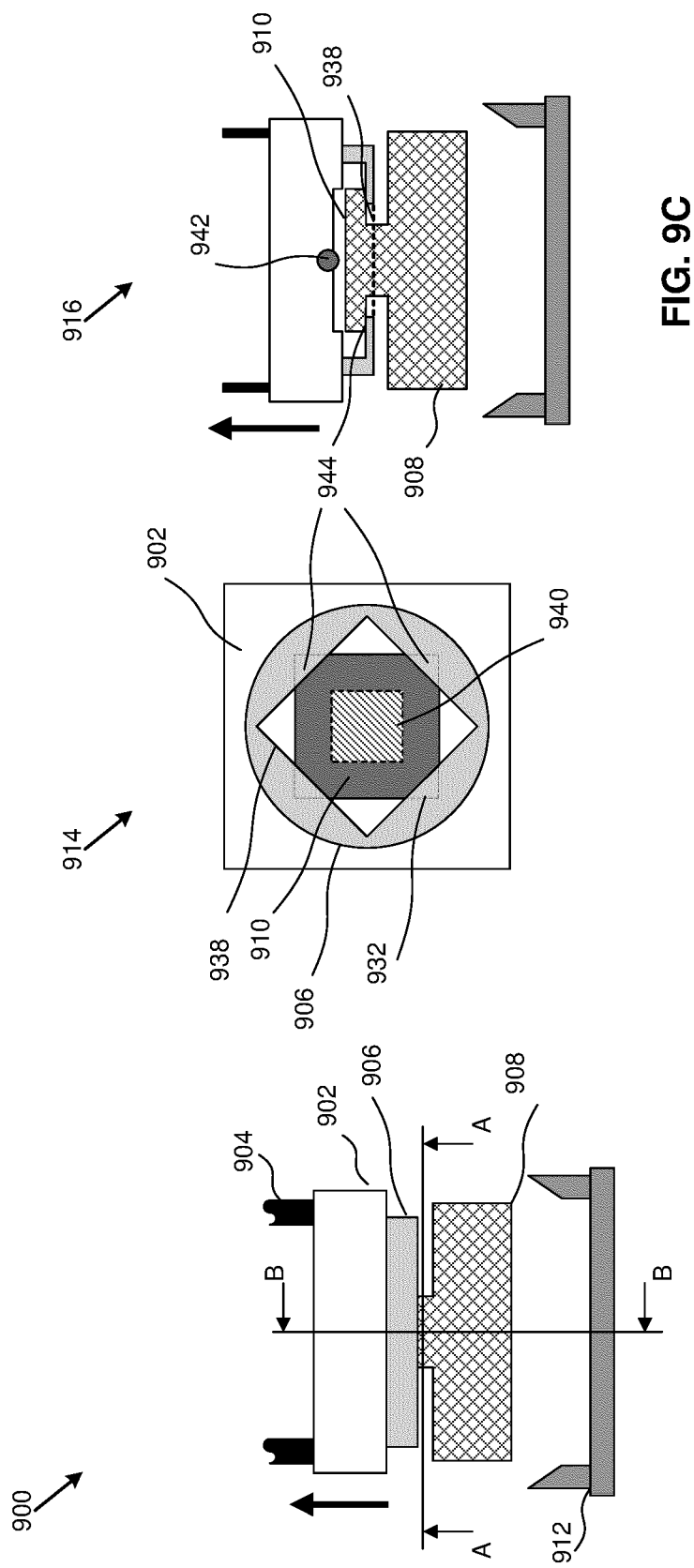

POD HANDLING SYSTEMS AND METHODS FOR A LITHOGRAPHIC DEVICE

CROSS-REFERENCE TO RELATED APPLICATIONS

This application claims priority of U.S. Provisional Patent Application No. 63/076,809, which was filed on Sep. 10, 2020, and which is incorporated herein in its entirety by reference.

FIELD

The present disclosure relates to a gripper device configured to hold and convey an object, e.g., a reticle pod, in a suspended state during transport.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which may be a mask or a reticle, can be used to generate a circuit pattern to be formed on an individual layer of the IC being formed. This pattern can be transferred onto a target portion (e.g., including part of, one, or several dies) on a substrate (e.g., a silicon wafer). Transfer of the pattern is typically via imaging onto a layer of radiation-sensitive material (e.g., resist) provided on the substrate. In general, a single substrate will contain a network of adjacent target portions that are successively patterned. Traditional lithographic apparatuses include so-called steppers, in which each target portion is irradiated by exposing an entire pattern onto the target portion at one time, and so-called scanners, in which each target portion is irradiated by scanning the pattern through a radiation beam in a given direction (the scanning direction) while synchronously scanning the target portions in a direction parallel to this scanning direction or in a direction parallel to, and opposite the scanning direction. It is also possible to transfer the pattern from the patterning device to the substrate by imprinting the pattern onto the substrate.

Extreme ultraviolet (EUV) light, for example, electromagnetic radiation having wavelengths of around 50 nanometers (nm) or less (also sometimes referred to as soft x-rays), and including light at a wavelength of about 13 nm, can be used in or with a lithographic apparatus to produce extremely small features in substrates such as, for example, silicon wafers. Methods to produce EUV light include, but are not necessarily limited to, converting a material that has an element, for example, xenon (Xe), lithium (Li), or tin (Sn), with an emission line in the EUV range, to a plasma state. For example, in one such method called laser produced plasma (LPP), the plasma can be produced by irradiating a target material, which is interchangeably referred to as fuel in the context of LPP sources, for example, in the form of a droplet, plate, tape, stream, or cluster of material, with an amplified light beam that can be referred to as a drive laser. For this process, the plasma is typically produced in a sealed vessel, for example, a vacuum chamber, and monitored using various types of metrology equipment.

A lithographic apparatus may include a supply chain and transfer mechanism for substrates. A universal pod, e.g., a reticle pod or a front opening uniform pod (FOUP), may be used to transfer the substrates. A reticle pod may be a specialized enclosure designed to securely and safely hold reticles or substrates in a controlled environment. The reticle pod allows reticles to be transferred within lithographic machines for processing and/or measurement. Specifications for mechanical features of pods, such as EUV pods, may be defined in Semiconductor Equipment and Materials International (SEMI) E100 and SEMI E152 standards. FOUPs may have a removable cassette with fins to hold the substrate in place, and a front opening door to allow robot handling mechanisms to access the substrates directly from the FOUP. A fully loaded reticle pod may weigh around 9 kilograms, such that automated material handling systems are used. Additionally, due to new designs, size, and implementations of lithographic apparatuses, it may no longer be feasible for operators to manually load these pods onto the load ports of these machines, which may be internal to the lithographic machines.

SUMMARY

There is a need for a transport system to safely and securely transport pods for processing.

The present disclosure describes various aspects of systems, apparatuses, and methods to provide for optical metrology and various other operations in an extreme ultra-violet (EUV) radiation system. More specifically, the current disclosure describes a handling system and method for handling reticle pods to allow for transport, loading, and unloading of the pods for processing and inspection of the reticles.

According to some embodiments, a system for transporting the pod is disclosed. The system may include a moving apparatus, a base coupled to the moving apparatus, and a gripping ring extending from the base. In some aspects, the gripping ring grips a flange extending from the pod. The moving apparatus moves the base in response to the gripping ring gripping the flange.

According to another embodiment, a lithographic apparatus including a system for transporting the pod is disclosed. The system may include a moving apparatus, a base coupled to the moving apparatus, and a gripping ring extending from the base. In some aspects, the gripping ring grips a flange extending from the pod. The moving apparatus moves the base in response to the gripping ring gripping the flange.

According to another embodiment, a gripping ring configured to grip a flange of a pod, where the pod is configured to retain a reticle, is disclosed. The gripping ring may include a ring wall defining an opening, where the opening has a shape corresponding to a shape of the flange. The gripping ring may include a ring lip, where the ring lip is a recess defined by the ring wall. An interior profile of the ring lip may correspond with an exterior profile of the flange.

Further features, as well as the structure and operation of various aspects, are described in detail below with reference to the accompanying drawings. It is noted that the disclosure is not limited to the specific aspects described or illustrated herein. Such aspects are presented herein for illustrative purposes only. Additional aspects will be apparent to persons skilled in the relevant art(s) based on the teachings contained herein.

BRIEF DESCRIPTION OF THE DRAWINGS

The accompanying drawings, which are incorporated herein and form part of the specification, illustrate the present disclosure and, together with the description, further serve to explain the principles of the aspects of this disclosure and to enable a person skilled in the relevant art(s) to make and use the aspects of this disclosure.

FIGS. 5A-5C illustrate a handling system, according to some embodiments.

FIGS. 6A-6D illustrate a handling system, according to some embodiments.

FIGS. 7A-7C illustrate operations and positions of a handling system, according to some embodiments.

FIGS. 8A-8C illustrate operations and positions of a handling system, according to some embodiments.

FIGS. 9A-9C illustrate operations and positions of a handling system, according to some embodiments.

Figure 1A:
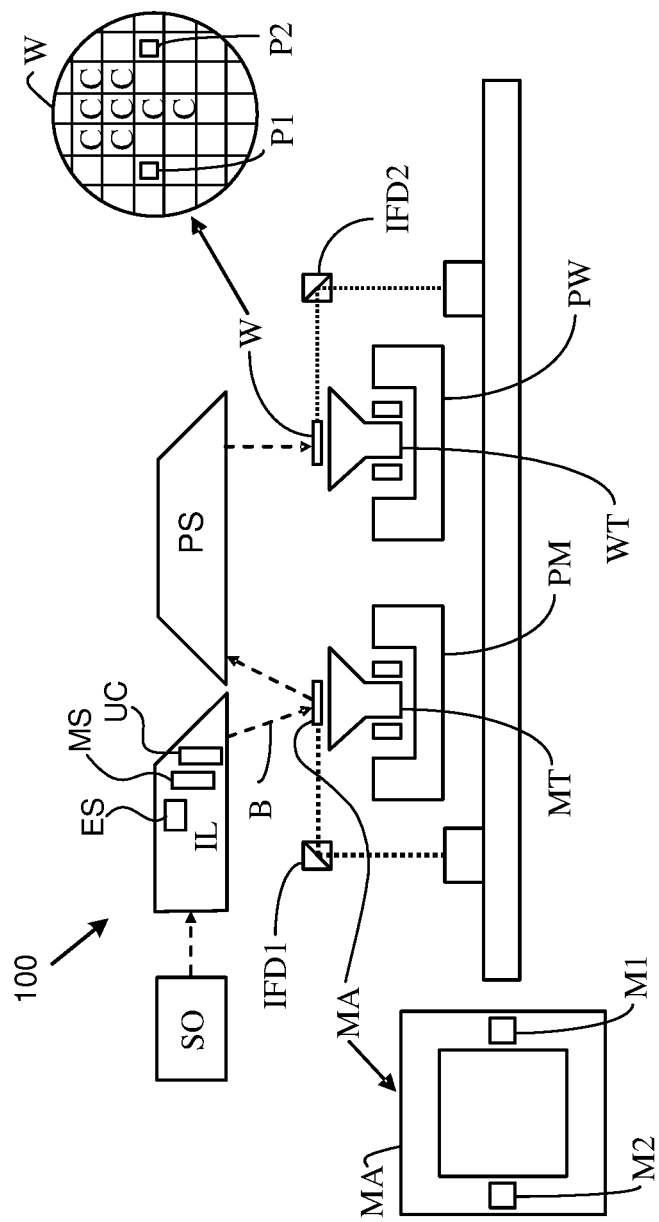
FIG. 1A is a schematic illustration of an example reflective lithographic apparatus according to some embodiments.

The features and advantages of the present disclosure will become more apparent from the detailed description set forth below when taken in conjunction with the drawings, in which like reference characters identify corresponding elements throughout. In the drawings, unless otherwise indicated, like reference numbers generally indicate identical, functionally similar, and/or structurally similar elements. Additionally, generally, the left-most digit(s) of a reference number identifies the drawing in which the reference number first appears. Unless otherwise indicated, the drawings provided throughout the disclosure should not be interpreted as to-scale drawings.

DETAILED DESCRIPTION

This specification discloses one or more embodiments that incorporate the features of the present disclosure. The disclosed embodiment(s) merely describe the present disclosure. The scope of the disclosure is not limited to the disclosed embodiment(s). The breadth and scope of the disclosure are defined by the claims appended hereto and their equivalents.

The embodiment(s) described, and references in the specification to "one embodiment," "an embodiment," "an example embodiment," "an exemplary embodiment," etc., indicate that the embodiment(s) described can include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to affect such feature, structure, or characteristic in connection with other embodiments whether or not explicitly described.

Spatially relative terms, such as "beneath," "below," "lower," "above," "on," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus can be otherwise oriented (rotated 90 degrees or at other orientations) and the spatially relative descriptors used herein may likewise be interpreted accordingly.

The term "about" as used herein indicates the value of a given quantity that can vary based on a particular technology. Based on the particular technology, the term "about" can indicate a value of a given quantity that varies within, for example, 10-30% of the value (e.g., ±10%, ±20%, or ±30% of the value).

Before describing such aspects in more detail, however, it is instructive to present an example environment in which aspects of the present disclosure can be implemented.

Example Lithographic Systems

Figure 1B:
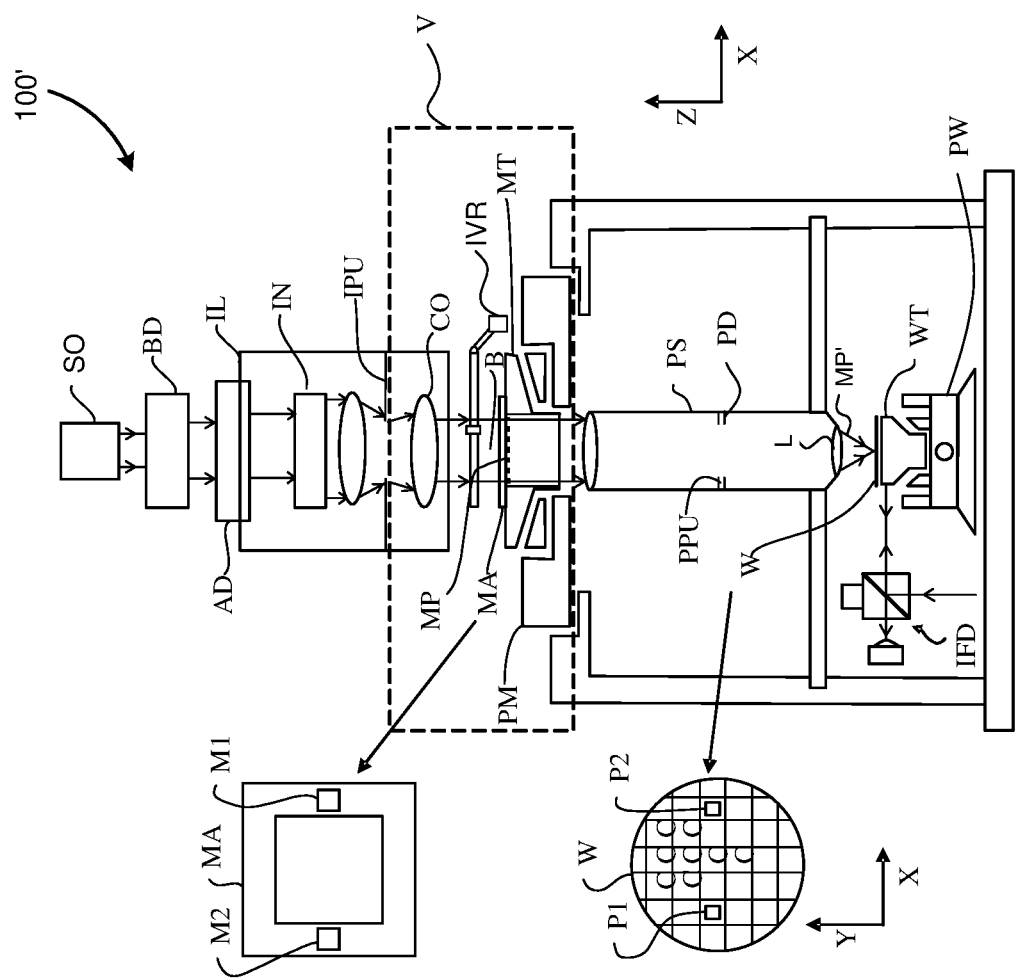
FIG. 1B is a schematic illustration of an example transmissive lithographic apparatus according to some aspects of the present disclosure.

FIGS. 1A and 1B are schematic illustrations of a lithographic apparatus 100 and lithographic apparatus 100', respectively, in which aspects of the present disclosure can be implemented. As shown in FIGS. 1A and 1B, the lithographic apparatuses 100 and 100' are illustrated from a point of view (e.g., a side view) that is normal to the XZ plane (e.g., the X-axis points to the right and the Z-axis points upward), while the patterning device MA and the substrate W are presented from additional points of view (e.g., a top view) that are normal to the XY plane (e.g., the X-axis points to the right and the Y-axis points upward).

Lithographic apparatus 100 and lithographic apparatus 100' each include the following: an illumination system IL (e.g., an illuminator) configured to condition a radiation beam B (e.g., a deep ultra violet (DUV) radiation beam or an extreme ultra violet (EUV) radiation beam); a support structure MT (e.g., a mask table) configured to support a patterning device MA (e.g., a mask, a reticle, or a dynamic patterning device) and connected to a first positioner PM configured to accurately position the patterning device MA; and, a substrate holder such as a substrate table WT (e.g., a wafer table) configured to hold a substrate W (e.g., a resist-coated wafer) and connected to a second positioner PW configured to accurately position the substrate W. Lithographic apparatuses 100 and 100' also have a projection system PS configured to project a pattern imparted to the radiation beam B by patterning device MA onto a target portion C (e.g., a portion including one or more dies) of the substrate W. In lithographic apparatus 100, the patterning device MA and the projection system PS are reflective. In lithographic apparatus 100', the patterning device MA and the projection system PS are transmissive.

The illumination system IL can include various types of optical components, such as refractive, reflective, catadioptric, magnetic, electromagnetic, electrostatic, or other types of optical components, or any combination thereof, for directing, shaping, or controlling the radiation beam B.

The support structure MT holds the patterning device MA in a manner that depends on the orientation of the patterning device MA with respect to a reference frame, the design of at least one of the lithographic apparatuses 100 and 100', and other conditions, such as whether or not the patterning device MA is held in a vacuum environment. The support structure MT can use mechanical, vacuum, electrostatic, or other clamping techniques to hold the patterning device MA. The support structure MT can be a frame or a table, for example, which can be fixed or movable, as required. By using sensors, the support structure MT can ensure that the patterning device MA is at a desired position, for example, with respect to the projection system PS.

The term "patterning device" MA should be broadly interpreted as referring to any device that can be used to impart a radiation beam B with a pattern in its cross-section, such as to create a pattern in the target portion C of the substrate W. The pattern imparted to the radiation beam B can correspond to a particular functional layer in a device being created in the target portion C to form an integrated circuit.

The patterning device MA can be transmissive (as in lithographic apparatus 100' of FIG. 1B) or reflective (as in lithographic apparatus 100 of FIG. 1A). Examples of patterning devices MA include reticles, masks, programmable mirror arrays, or programmable LCD panels. Masks include mask types such as binary, alternating phase shift, or attenuated phase shift, as well as various hybrid mask types. An example of a programmable mirror array employs a matrix arrangement of small mirrors, each of which can be individually tilted so as to reflect an incoming radiation beam in different directions. The tilted mirrors impart a pattern in the radiation beam B, which is reflected by a matrix of small mirrors.

The term "projection system" PS can encompass any type of projection system, including refractive, reflective, catadioptric, magnetic, electromagnetic and electrostatic optical systems, or any combination thereof, as appropriate for the exposure radiation being used, or for other factors, such as the use of an immersion liquid on the substrate W or the use of a vacuum. A vacuum environment can be used for EUV or electron beam radiation since other gases can absorb too much radiation or electrons. A vacuum environment can therefore be provided to the whole beam path with the aid of a vacuum wall and vacuum pumps.

Lithographic apparatus 100 and/or lithographic apparatus 100' can be of a type having two (dual stage) or more substrate tables WT (and/or two or more mask tables). In such "multiple stage" machines, the additional substrate tables WT can be used in parallel, or preparatory steps can be carried out on one or more tables while one or more other substrate tables WT are being used for exposure. In some situations, the additional table may not be a substrate table WT.

The lithographic apparatus can also be of a type wherein at least a portion of the substrate can be covered by a liquid having a relatively high refractive index, e.g., water, so as to fill a space between the projection system and the substrate. An immersion liquid can also be applied to other spaces in the lithographic apparatus, for example, between the mask and the projection system. Immersion techniques provide for increasing the numerical aperture of projection systems. The term "immersion" as used herein does not mean that a structure, such as a substrate, must be submerged in liquid, but rather only means that liquid is located between the projection system and the substrate during exposure.

Referring to FIGS. 1A and 1B, the illumination system IL receives a radiation beam B from a radiation source SO. The radiation source SO and the lithographic apparatus 100 or 100' can be separate physical entities, for example, when the radiation source SO is an excimer laser. In such cases, the radiation source SO is not considered to form part of the lithographic apparatus 100 or 100', and the radiation beam B passes from the radiation source SO to the illumination system IL with the aid of a beam delivery system BD (e.g., shown in FIG. 1B) including, for example, suitable directing mirrors and/or a beam expander. In other cases, the radiation source SO can be an integral part of the lithographic apparatus 100 or 100', for example, when the radiation source SO is a mercury lamp. The radiation source SO and the illuminator IL, together with the beam delivery system BD, if required, can be referred to as a radiation system.

The illumination system IL can include an adjuster AD (e.g., shown in FIG. 1B) for adjusting the angular intensity distribution of the radiation beam. Generally, at least the outer and/or inner radial extent (commonly referred to as "σ-outer" and "σ-inner," respectively) of the intensity distribution in a pupil plane of the illuminator can be adjusted. In addition, the illumination system IL can include various other components (e.g., shown in FIG. 1B), such as an integrator IN and a radiation collector CO (e.g., a condenser or collector optic). The illumination system IL can be used to condition the radiation beam B to have a desired uniformity and intensity distribution in its cross section.

Referring to FIG. 1A, the radiation beam B is incident on the patterning device MA (e.g., a mask), which is held on the support structure MT (e.g., a mask table), and is patterned by the patterning device MA. In lithographic apparatus 100, the radiation beam B is reflected from the patterning device MA. After being reflected from the patterning device MA, the radiation beam B passes through the projection system PS, which focuses the radiation beam B onto a target portion C of the substrate W. With the aid of the second positioner PW and position sensor IFD2 (e.g., an interferometric device, linear encoder, or capacitive sensor), the substrate table WT can be moved accurately (e.g., so as to position different target portions C in the path of the radiation beam B). Similarly, the first positioner PM and another position sensor IFD1 (e.g., an interferometric device, linear encoder, or capacitive sensor) can be used to accurately position the patterning device MA with respect to the path of the radiation beam B. Patterning device MA and substrate W can be aligned using mask alignment marks M1 and M2 and substrate alignment marks P1 and P2.

Referring to FIG. 1B, the radiation beam B is incident on the patterning device MA, which is held on the support structure MT, and is patterned by the patterning device MA. Having traversed the patterning device MA, the radiation beam B passes through the projection system PS, which focuses the beam onto a target portion C of the substrate W. The projection system has a pupil conjugate PPU to an illumination system pupil IPU. Portions of radiation emanate from the intensity distribution at the illumination system pupil IPU and traverse a mask pattern without being affected by diffraction at the mask pattern and create an image of the intensity distribution at the illumination system pupil IPU.

The projection system PS projects an image MP' of the mask pattern MP, where image MP' is formed by diffracted beams produced from the mask pattern MP by radiation from the intensity distribution, onto a resist layer coated on the substrate W. For example, the mask pattern MP can include an array of lines and spaces. A diffraction of radiation at the array and different from zeroth-order diffraction generates diverted diffracted beams with a change of direction in a direction perpendicular to the lines. Undiffracted beams (e.g., so-called zeroth-order diffracted beams) traverse the pattern without any change in propagation direction. The zeroth-order diffracted beams traverse an upper lens or upper lens group of the projection system PS, upstream of the pupil conjugate PPU of the projection system PS, to reach the pupil conjugate PPU. The portion of the intensity distribution in the plane of the pupil conjugate PPU and associated with the zeroth-order diffracted beams is an image of the intensity distribution in the illumination system pupil IPU of the illumination system IL. The aperture device PD, for example, is disposed at or substantially at a plane that includes the pupil conjugate PPU of the projection system PS.

With the aid of the second positioner PW and position sensor IFD (e.g., an interferometric device, linear encoder, or capacitive sensor), the substrate table WT can be moved accurately (e.g., so as to position different target portions C in the path of the radiation beam B). Similarly, the first positioner PM and another position sensor (not shown in FIG. 1B) can be used to accurately position the patterning device MA with respect to the path of the radiation beam B (e.g., after mechanical retrieval from a mask library or during a scan).

In general, movement of the support structure MT can be realized with the aid of a long-stroke positioner (coarse positioning) and a short-stroke positioner (fine positioning), which form part of the first positioner PM. Similarly, movement of the substrate table WT can be realized using a long-stroke positioner and a short-stroke positioner, which form part of the second positioner PW. In the case of a stepper (as opposed to a scanner), the support structure MT can be connected to a short-stroke actuator only or can be fixed. Patterning device MA and substrate W can be aligned using mask alignment marks M1, M2, and substrate alignment marks P1, P2. Although the substrate alignment marks (as illustrated) occupy dedicated target portions, they can be located in spaces between target portions (e.g., scribe-lane alignment marks). Similarly, in situations in which more than one die is provided on the patterning device MA, the mask alignment marks can be located between the dies.

Support structure MT and patterning device MA can be in a vacuum chamber V, where an in-vacuum robot IVR can be used to move patterning devices such as a mask in and out of vacuum chamber. Alternatively, when support structure MT and patterning device MA are outside of the vacuum chamber, an out-of-vacuum robot can be used for various transportation operations, similar to the in-vacuum robot IVR. In some instances, both the in-vacuum and out-of-vacuum robots need to be calibrated for a smooth transfer of any payload (e.g., a mask) to a fixed kinematic mount of a transfer station.

The lithographic apparatuses 100 and 100' can be used in at least one of the following modes:

1. In step mode, the support structure MT and the substrate table WT are kept essentially stationary, while an entire pattern imparted to the radiation beam B is projected onto a target portion C at one time (e.g., a single static exposure). The substrate table WT is then shifted in the X and/or Y direction so that a different target portion C can be exposed.

2. In scan mode, the support structure MT and the substrate table WT are scanned synchronously while a pattern imparted to the radiation beam B is projected onto a target portion C (e.g., a single dynamic exposure). The velocity and direction of the substrate table WT relative to the support structure MT (e.g., mask table) can be determined by the (de-)magnification and image reversal characteristics of the projection system PS.

3. In another mode, the support structure MT is kept substantially stationary holding a programmable patterning device MA, and the substrate table WT is moved or scanned while a pattern imparted to the radiation beam B is projected onto a target portion C. A pulsed radiation source SO can be employed and the programmable patterning device is updated as required after each movement of the substrate table WT or in between successive radiation pulses during a scan. This mode of operation can be readily applied to maskless lithography that utilizes a programmable patterning device MA, such as a programmable mirror array.

Combinations and/or variations on the described modes of use or entirely different modes of use can also be employed.

In a further aspect, lithographic apparatus 100 includes an EUV source, which is configured to generate a beam of EUV radiation for EUV lithography. In general, the EUV source is configured in a radiation system, and a corresponding illumination system is configured to condition the EUV radiation beam of the EUV source.

Figure 2A:
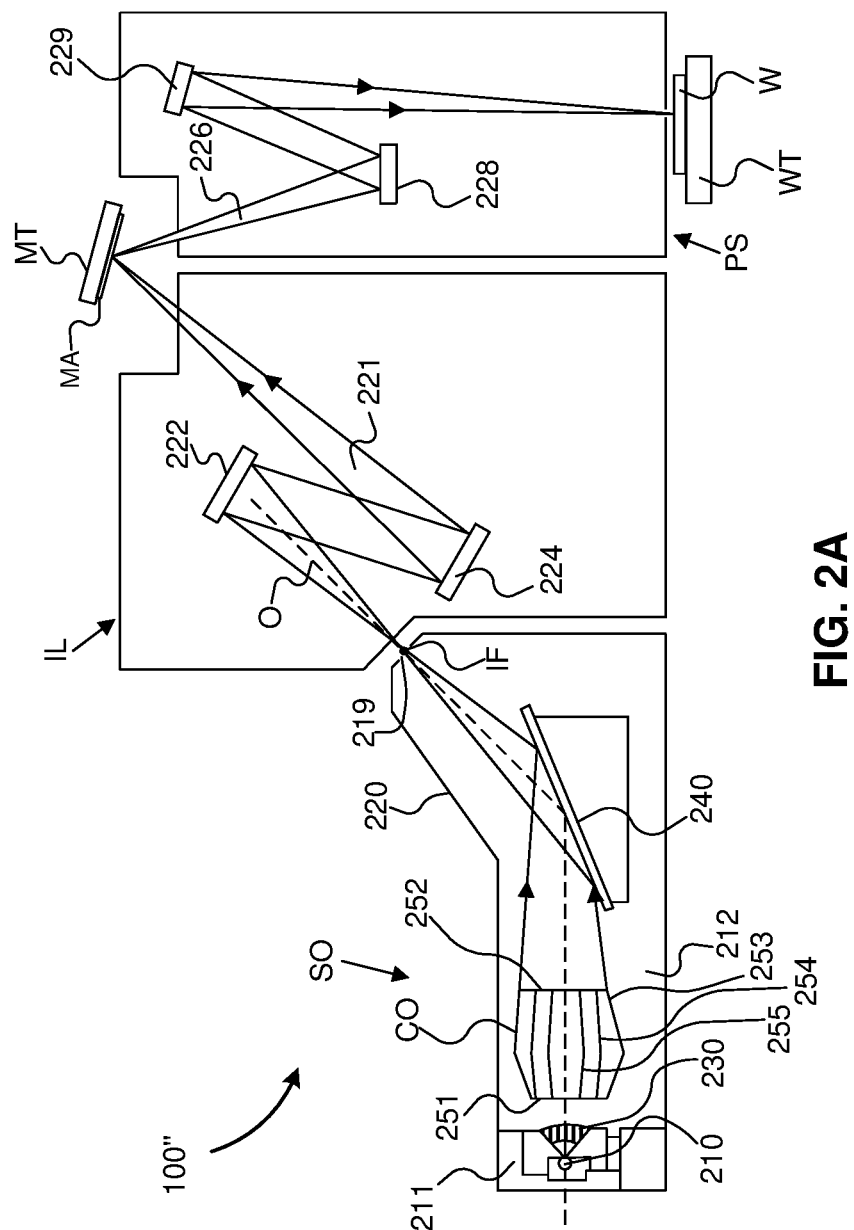
FIGS. 2A, 2B, and 3 show more detailed schematics of a reflective lithographic apparatus, according to some embodiments.

FIG. 2A shows the lithographic apparatus 100 in more detail, including the radiation source SO (e.g., a source collector apparatus), the illumination system IL, and the projection system PS. As shown in FIG. 2A, the lithographic apparatus 100 is illustrated from a point of view (e.g., a side view) that is normal to the XZ plane (e.g., the X-axis points to the right and the Z-axis points upward).

The radiation source SO is constructed and arranged such that a vacuum environment can be maintained in an enclosing structure 220. The radiation source SO includes a source chamber 211 and a collector chamber 212 and is configured to produce and transmit EUV radiation. EUV radiation can be produced by a gas or vapor, for example xenon (Xe) gas, lithium (Li) vapor, or tin (Sn) vapor in which an EUV radiation emitting plasma 210 is created to emit radiation in the EUV range of the electromagnetic spectrum. The EUV radiation emitting plasma 210, at least partially ionized, can be created by, for example, an electrical discharge or a laser beam. Partial pressures of, for example, about 10.0 pascals (Pa) of Xe gas, Li vapor, Sn vapor, or any other suitable gas or vapor can be used for efficient generation of the radiation. In some aspects, a plasma of excited Sn is provided to produce EUV radiation.

The radiation emitted by the EUV radiation emitting plasma 210 is passed from the source chamber 211 into the collector chamber 212 via an optional gas barrier or contaminant trap 230 (e.g., in some cases also referred to as contaminant barrier or foil trap), which is positioned in or behind an opening in source chamber 211. The contaminant trap 230 can include a channel structure. Contamination trap 230 can also include a gas barrier or a combination of a gas barrier and a channel structure. The contaminant trap 230 further indicated herein at least includes a channel structure.

The collector chamber 212 can include a radiation collector CO (e.g., a condenser or collector optic), which can be a so-called grazing incidence collector. Radiation collector CO has an upstream radiation collector side 251 and a downstream radiation collector side 252. Radiation that traverses radiation collector CO can be reflected off a grating spectral filter 240 to be focused in a virtual source point IF. The virtual source point IF is commonly referred to as the intermediate focus, and the source collector apparatus is arranged such that the virtual source point IF is located at or near an opening 219 in the enclosing structure 220. The virtual source point IF is an image of the EUV radiation emitting plasma 210. Grating spectral filter 240 is used in particular for suppressing infrared (IR) radiation.

Subsequently the radiation traverses the illumination system IL, which can include a faceted field mirror device 222 and a faceted pupil mirror device 224 arranged to provide a desired angular distribution of the radiation beam 221, at the patterning device MA, as well as a desired uniformity of radiation intensity at the patterning device MA. Upon reflection of the radiation beam 221 at the patterning device MA, held by the support structure MT, a patterned beam 226 is formed and the patterned beam 226 is imaged by the projection system PS via reflective elements 228, 229 onto a substrate W held by the wafer stage or substrate table WT.

More elements than shown can generally be present in illumination system IL and projection system PS. Optionally, the grating spectral filter 240 can be present depending upon the type of lithographic apparatus. Further, there can be more mirrors present than those shown in the FIG. 2. For example, there can be one to six additional reflective elements present in the projection system PS than shown in FIG. 2A.

Radiation collector CO, as illustrated in FIG. 2A, is depicted as a nested collector with grazing incidence reflectors 253, 254, and 255, just as an example of a collector (or collector mirror). The grazing incidence reflectors 253, 254, and 255 are disposed axially symmetric around an optical axis O and a radiation collector CO of this type is preferably used in combination with a discharge produced plasma (DPP) source.

Figure 2B:
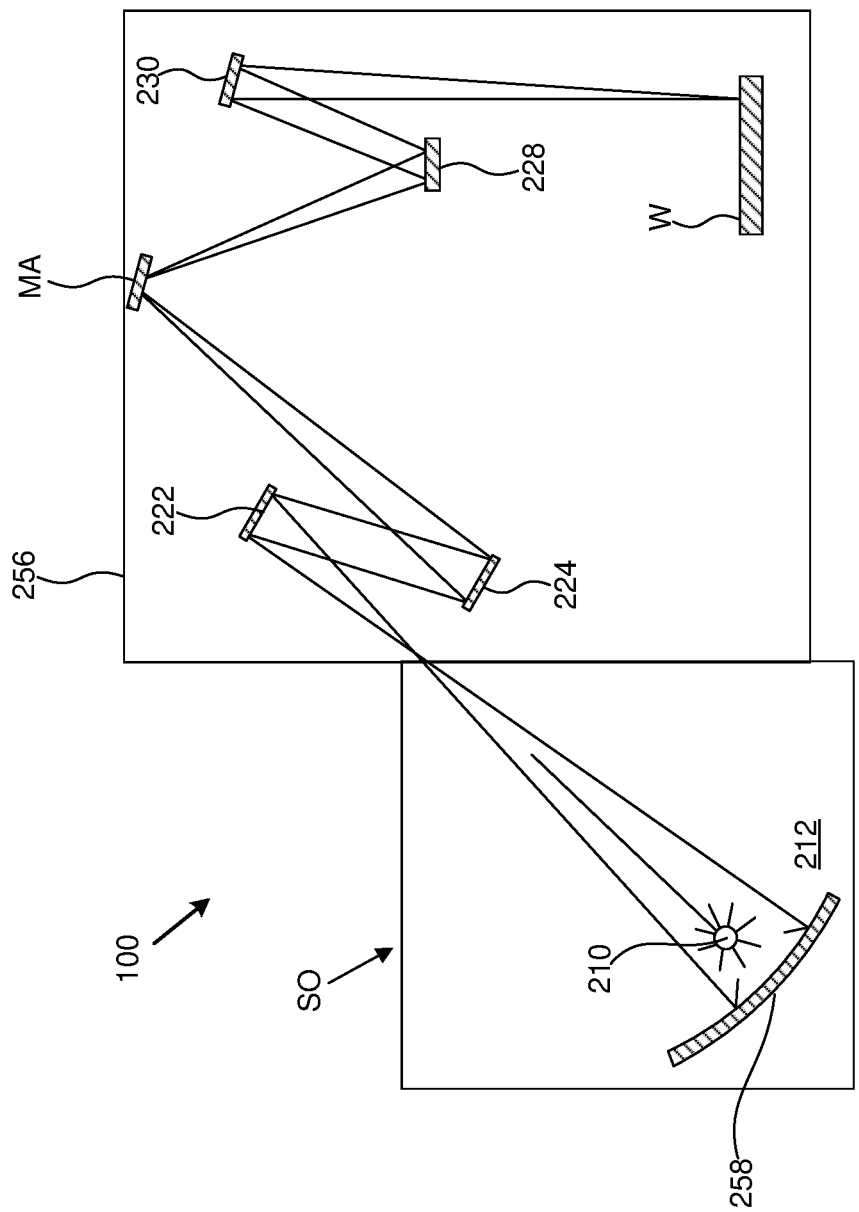

FIG. 2B shows a schematic view of selected portions of lithographic apparatus 100 (e.g., FIG. 1), but with alternative collection optics in the source collector apparatus SO, according to some embodiments. It should be appreciated that structures shown in FIG. 2A that do not appear in FIG. 2B (for drawing clarity) may still be included in embodiments referring to FIG. 2B. Elements in FIG. 2B having the same reference numbers as those in FIG. 2A have the same or substantially similar structures and functions as described in reference to FIG. 2A.

In some embodiments, the lithographic apparatus 100 can be used, for example, to expose a substrate W such as a resist coated wafer with a patterned beam of EUV light. In FIG. 2B, the illumination system IL and the projection system PS are represented combined as an exposure device 256 (e.g., an integrated circuit lithography tool such as a stepper, scanner, step and scan system, direct write system, device using a contact and/or proximity mask, etc.) that uses EUV light from the source collector apparatus SO. The lithographic apparatus 100 can also include collector optic 258 that reflects EUV light from the hot plasma 210 along a path into the exposure device 256 to irradiate the substrate W. Collector optic 258 can comprise a near-normal incidence collector mirror having a reflective surface in the form of a prolate spheroid (i.e., an ellipse rotated about its major axis) having, e.g., a graded multi-layer coating with alternating layers of Molybdenum and Silicon, and in some cases, one or more high temperature diffusion barrier layers, smoothing layers, capping layers and/or etch stop layers.

Figure 3:
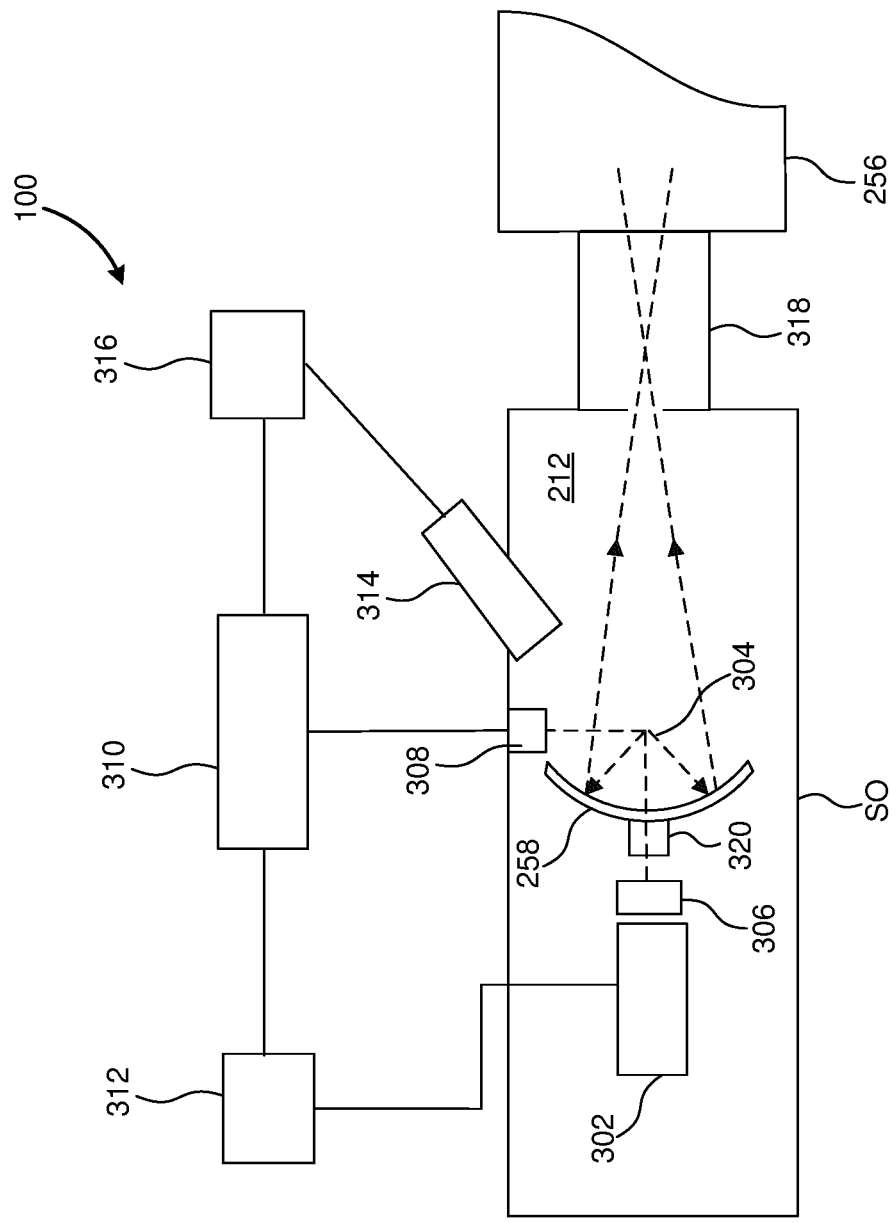

FIG. 3 shows a detailed view of a portion of lithographic apparatus 100 (e.g., FIGS. 1, 2A, and 2B), according to one or more embodiments. Elements in FIG. 3 having the same reference numbers as those in FIGS. 1, 2A, and 2B have the same or substantially similar structures and functions as described in reference to FIGS. 1, 2A, and 2B. In some embodiments, lithographic apparatus 100 can include a source collector apparatus SO having an LPP EUV light radiator. As shown, the source collector apparatus SO may include a laser system 302 for generating a train of light pulses and delivering the light pulses into a light source chamber 212. For the lithographic apparatus 100, the light pulses may travel along one or more beam paths from the laser system 302 and into the chamber 212 to illuminate a source material at an irradiation region 304 to generate a plasma (e.g., plasma region where hot plasma 210 is in FIG. 2B) that produces EUV light for substrate exposure in the exposure device 256.

In some embodiments, suitable lasers for use in the laser system 302 can include a pulsed laser device, e.g., a pulsed gas discharge CO2 laser device producing radiation at 9.3 pm or 10.6 pm, e.g., with DC or RF excitation, operating at relatively high power, e.g., 10 kW or higher and high pulse repetition rate, e.g., 50 kHz or more. In some embodiments, the laser may be an axial-flow RF-pumped CO2 laser having an oscillator amplifier configuration (e.g., master oscillator/power amplifier (MOPA) or power oscillator/power amplifier (POPA)) with multiple stages of amplification and having a seed pulse that is initiated by a Q-switched oscillator with relatively low energy and high repetition rate, e.g., capable of 100 kHz operation. From the oscillator, the laser pulse may then be amplified, shaped and/or focused before reaching the irradiation region 304. Continuously pumped CO2 amplifiers may be used for the laser system 302. Alternatively, the laser may be configured as a so-called "self-targeting" laser system in which the droplet serves as one mirror of the optical cavity of the laser.

In some embodiments, depending on the application, other types of lasers may also be suitable, e.g., an excimer or molecular fluorine laser operating at high power and high pulse repetition rate. Some examples include, a solid state laser, e.g., having a fiber, rod, slab, or disk-shaped active media, other laser architectures having one or more chambers, e.g., an oscillator chamber and one or more amplifying chambers (with the amplifying chambers in parallel or in series), a master oscillator/power oscillator (MOPO) arrangement, a master oscillator/power ring amplifier (MOPRA) arrangement, or a solid state laser that seeds one or more excimer, molecular fluorine or CO2 amplifier or oscillator chambers, may be suitable. Other suitable designs may be envisioned.

In some embodiments, a source material may first be irradiated by a pre-pulse and thereafter irradiated by a main pulse. Pre-pulse and main pulse seeds may be generated by a single oscillator or two separate oscillators. One or more common amplifiers may be used to amplify both the pre-pulse seed and main pulse seed. In some embodiments, separate amplifiers may be used to amplify the pre-pulse and main pulse seeds.

In some embodiments, the lithographic apparatus 100 can include a beam conditioning unit 306 having one or more optics for beam conditioning such as expanding, steering, and/or focusing the beam between the laser system 302 and irradiation region 304. For example, a steering system, which may include one or more mirrors, prisms, lenses, etc., may be provided and arranged to steer the laser focal spot to different locations in the chamber 212. For example, the steering system may include a first flat mirror mounted on a tip-tilt actuator which may move the first mirror independently in two dimensions, and a second flat mirror mounted on a tip-tilt actuator which may move the second mirror independently in two dimensions. With the described arrangement(s), the steering system may controllably move the focal spot in directions substantially orthogonal to the direction of beam propagation (beam axis or optical axis).

The beam conditioning unit 306 can include a focusing assembly to focus the beam to the irradiation region 304 and adjust the position of the focal spot along the beam axis. For the focusing assembly, an optic, such as a focusing lens or mirror, may be used that is coupled to an actuator for movement in a direction along the beam axis to move the focal spot along the beam axis.

In some embodiments, the source collector apparatus SO may also include a source material delivery system 308, e.g., delivering source material, such as Sn droplets, into the interior of chamber 212 to an irradiation region 304, where the droplets will interact with light pulses from the laser system 302, to ultimately produce plasma and generate an EUV emission to expose a substrate such as a resist coated wafer in the exposure device 256. More details regarding various droplet dispenser configurations may be found in, e.g., U.S. Pat. No. 7,872,245, issued on Jan. 18, 2011, titled "Systems and Methods for Target Material Delivery in a Laser Produced Plasma EUV Light Source", U.S. Pat. No. 7,405,416, issued on Jul. 29, 2008, titled "Method and Apparatus For EUV Plasma Source Target Delivery", U.S. Pat. No. 7,372,056, issued on May 13, 2008, titled "LPP EUV Plasma Source Material Target Delivery System", and International Appl. No. WO 2019/137846, titled "Apparatus for and Method of Controlling Coalescence of Droplets In a Droplet Stream", published on Jul. 18, 2019, the contents of each of which are incorporated by reference herein in their entirety.

In some embodiments, the source material for producing an EUV light output for substrate exposure may include, but is not necessarily limited to, a material that includes tin, lithium, xenon or combinations thereof. The EUV emitting element, e.g., tin, lithium, xenon, etc., may be in the form of liquid droplets and/or solid particles contained within liquid droplets. For example, the element tin may be used as pure tin, as a tin compound, e.g., $SnBr_4$, $SnBr_2$, $SnH_4$, as a tin alloy, e.g., tin-gallium alloys, tin-indium alloys, tin-indium-gallium alloys, or a combination thereof. Depending on the material used, the source material may be presented to the irradiation region at various temperatures including room temperature or near room temperature (e.g., tin alloys, $SnBr_4$), at an elevated temperature, (e.g., pure tin) or at temperatures below room temperature, (e.g., $SnH_4$), and in some cases, can be relatively volatile, e.g., $SnBr_4$.

In some embodiments, the lithographic apparatus 100 can also include a controller 310, which can also include a drive laser control system 312 for controlling devices in the laser system 302 to thereby generate light pulses for delivery into the chamber 212, and/or for controlling movement of optics in the beam conditioning unit 306. The lithographic apparatus 100 can also include a droplet position detection system which may include one or more droplet imagers 314 that provide an output signal indicative of the position of one or more droplets, e.g., relative to the irradiation region 304. The droplet imager(s) 314 can provide this output to a droplet position detection feedback system 316, which can, e.g., compute a droplet position and trajectory, from which a droplet error can be computed, e.g., on a droplet-by-droplet basis, or on average. The droplet error may then be provided as an input to the controller 310, which can, for example, provide a position, direction and/or timing correction signal to the laser system 302 to control laser trigger timing and/or to control movement of optics in the beam conditioning unit 306, e.g., to change the location and/or focal power of the light pulses being delivered to the irradiation region 304 in the chamber 212. Also for the source collector apparatus SO, the source material delivery system 308 can have a control system operable in response to a signal (which in some implementations may include the droplet error described above, or some quantity derived therefrom) from the controller 310, to e.g., modify the release point, initial droplet stream direction, droplet release timing and/or droplet modulation to correct for errors in the droplets arriving at the irradiation region 304.

In some embodiments, the lithographic apparatus 100 can also include a collector optic a gas dispenser device 320. Gas dispenser device 320 can dispense gas in the path of the source material from the source material delivery system 308 (e.g., irradiation region 304). Gas dispenser device 320 can comprise a nozzle through which dispensed gas may exit. Gas dispenser device 320 can be structured (e.g., having an aperture) such that, when placed near the optical path of laser system 302, light from laser system 302 is not blocked by gas dispenser device 320 and is allowed to reach the irradiation region 304. A buffer gas such as hydrogen, helium, argon or combinations thereof, may be introduced into, replenished and/or removed from the chamber 212. The buffer gas may be present in the chamber 212 during plasma discharge and may act to slow plasma created ions, to reduce degradation of optics, and/or increase plasma efficiency. Alternatively, a magnetic field and/or electric field (not shown) may be used alone, or in combination with a buffer gas, to reduce fast ion damage.

In some embodiments, the lithographic apparatus 100 can also include a collector optic 258 such as a near-normal incidence collector mirror having a reflective surface in the form of a prolate spheroid (i.e., an ellipse rotated about its major axis) having, e.g., a graded multi-layer coating with alternating layers of Molybdenum and Silicon, and in some cases, one or more high temperature diffusion barrier layers, smoothing layers, capping layers and/or etch stop layers. Collector optic 258 can be formed with an aperture to allow the light pulses generated by the laser system 302 to pass through and reach the irradiation region 304. The same, or another similar aperture, may be used to allow gas from the gas dispenser device 320 to flow into chamber 212. As shown, the collector optic 258 can be, e.g., a prolate spheroid mirror that has a first focus within or near the irradiation region 304 and a second focus at a so-called intermediate region 318, where the EUV light may be output from the source collector apparatus SO and input to an exposure device 256 utilizing EUV light, e.g., an integrated circuit lithography tool. It is to be appreciated that other optics may be used in place of the prolate spheroid mirror for collecting and directing light to an intermediate location for subsequent delivery to a device utilizing EUV light. Embodiments using the collector optic CO (FIG. 2A) with structures and functions described in reference to FIG. 3 may also be envisioned.

Example Lithographic Cell

Figure 4:
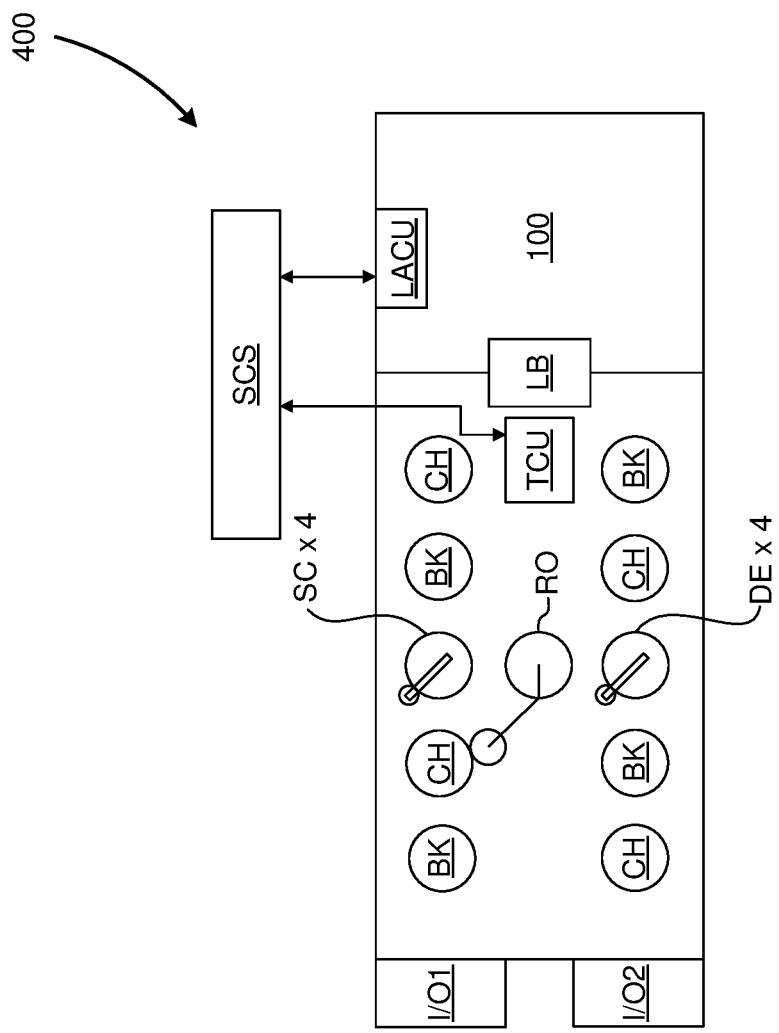
FIG. 4 is a schematic illustration of an example radiation source for an example reflective lithographic apparatus according to some embodiments.

FIG. 4 shows a lithographic cell 400, also sometimes referred to as a lithocell or cluster. Lithographic apparatus 100 or 100' can form part of lithographic cell 400. Lithographic cell 400 can also include one or more apparatuses to perform pre- and post-exposure processes on a substrate. For example, these apparatuses can include spin coaters SC to deposit resist layers, developers DE to develop exposed resist, chill plates CH, and bake plates BK. A substrate handler RO (e.g., a robot) picks up substrates from input/output ports I/O1 and I/O2, moves them between the different process apparatuses and delivers them to the loading bay LB of the lithographic apparatus 100 or 100'. These devices, which are often collectively referred to as the track, are under the control of a track control unit TCU, which is itself controlled by a supervisory control system SCS, which also controls the lithographic apparatus via lithography control unit LACU. Thus, the different apparatuses can be operated to maximize throughput and processing efficiency.

Pod Handler

FIG. 5A is an illustration of a handling system 500, according to some embodiments. Handling system 500 may be a pod handling system. Pod handling system 500 may include a base 502, e.g., a pod gripper base, a moving apparatus 504, e.g., lift belt(s), extensions 506, e.g., gripping fingers that extend from pod gripper base 502, a pod 508 having a flange 510, and a loading station or load port 512. In some aspects, a load port may refer to a port included in a lithographic processing chamber. In some aspects, load port 512 may be referred to as a station when it is used as a location to load a pod 508 into a lithography system. In other aspects, load port 512 may be referred to as a port when it functions as a device that opens the pods and exposes the reticles for lithography processing. In one example, handling system 500 may be part of an integrated pod transport system that transports pods to/from load ports to/from other load ports and/or manual load stations (not shown).

According to some embodiments, base 502 may be controlled (through lift operations) by moving apparatus 504. Moving apparatus 504 may be part of a hoist system. According to some embodiments, moving apparatus 504 of a hoisting system may include cables (or lift belts) and a cable wrapping device (e.g., a drum) that may wrap the cables in synchronization. The synchronization may be controlled by a control system, e.g., controller 310. According to some aspects, the hoisting system may include a lifting mechanism which may sit on a translational unit that moves on a track system between a lithography tool and other components of the lithography machine. While a hoisting system is described herein, it can be appreciated that other moving/lifting systems can be envisioned, including, for example, linear actuator systems.

According to some embodiments, extensions 506 are designed to grip a pod 508 from flange 510. In some aspects, extensions 506 may be used to insert or remove pod 508 from station 512.

FIGS. 5B and 5C show cross sections 514 and 516 of handling system 500 along the BB line in FIG. 5A, according to some embodiments.

According to some embodiments, cross section 514 shows extensions 506 (FIG. 5A) as fingers 518 where arrows 520 represent the lateral movement of fingers 518. According to some embodiments, fingers 518 can move outwardly and inwardly in a horizontal motion to capture pod 508 from flange 510. In some aspects, movement of this type may experience unwanted sideways forces and servo motor failures. According to some embodiments, base 502 may include a servo motor (not shown). A servo motor may be a rotary or linear actuator that allows for control of linear or angular position, velocity and acceleration. The servo motor may include a suitable motor coupled to a sensor for position feedback. Fingers 518, and 522 (FIG. 5C) may be configured to be moved linearly (fingers 518) or rotate angularly (fingers 522) through movement and control provided by one or more servo motors (not shown).

However, this design may suffer from drawbacks relating to failures of servo motors and design complexities. Some common causes of servo motor failure may include, but not limited to, overheating, over current and electrical surges, moisture, dirt, and vibration. Other causes of failure may relate to unintended operator error, such as wrongfully selecting ungrip command while the pod is lifted. Keeping the servo motor maintained and running is vital to any industrial business, robotics, and machinery. Downtime from faulty servo motors can be a costly operation, both in terms of financial impact and down times. Moreover, faulty servo motors may also lead to dropping of pod 508, which is very expensive equipment. In some aspects, movement of this type may also call for additional architecture to mitigate potential dropping of pod 508, such as couplers (e.g., to couple ends of fingers 518 or 522 to the pod 508), catching devices, and the like.

In some aspects, similar to cross section 514, cross section 516 shows gripping fingers 508 (FIG. 5A) as fingers 522, where arrows 524 represent the angular movement of fingers 522. According to some embodiments, fingers 522 rotate in directions shown by arrows 524. In one example, fingers 522 may rotate upwardly while base 502 is lowered so as to create sufficient space for the fingers 522. And in some aspects, fingers 522 may rotate downwardly and be placed under flange 510 to pick up pod 508. In some aspects, different finger sizes may be used that may or may not sufficiently grip flange 510. In some aspects, this may lead to disengagement between flange 510 and fingers 518 or 522 due to insufficient contact between the fingers 518 or 522 and the flange 510. Additionally, in some aspects an end of each finger 522 may be coupled to the pod 508, thus additional mechanical components may be needed that may also be subject to fault. In some aspects, drop protection may be used (e.g., a safety catch) to mitigate servo motor failure.

FIGS. 6A-6D illustrate a handling system 600, according to some embodiments. In some aspects, a difference between the handling systems 500 and 600 is the configuration of extension 506, e.g., gripping fingers, and extension 606, e.g., a gripping ring. In some embodiments, gripping fingers 506 are replaced by gripping ring 606. Gripping ring 606 provides changes to the gripping fingers 506 described above. For example, gripping ring 606 can include a built-in self-locking solution, substantially reducing or eliminating pod drop risks. Furthermore, the design of gripping ring 606 may substantially reduce or eliminate safety catches. As will be further illustrated herein, gripping ring 606 can provide gripping and rotation functionality. Moreover, gripping ring 606 can remove the use of servo motors associated with the above-mentioned fingers 506. This, accordingly, can reduce or eliminate internal safety components (e.g., breaks or latches) to motors, thereby, improving safety.

FIG. 6A is an illustration of handling system 600, according to some embodiments. Handling system 600 may include base 602, e.g., a pod gripper base, a moving apparatus 604, e.g., lift belt(s), gripping ring 606, pod 608 having flange 610, and station/port 612.

According to some embodiments, FIG. 6B illustrates a gripping ring 606 that may be attached to base 602. According to some embodiments, gripping ring 606 may be a rotatable ring that may be rotated longitudinally about base 602. According to some embodiments, gripping ring 606 may include a ring wall 630 and a ring lip 632 including ring lip edges 634. According to some embodiments, ring wall 630 may be configured to include mounting assembly components 636 that allow gripping ring 606 to be attached to base 602. According to some embodiments, ring lip 632 may be a recess defined by ring wall 630 and and/or ring lip edges 634. An interior profile of the ring lip 632 may correspond to an exterior profile of the flange 610. Ring lip edges 634 may be configured to receive and/or secure the flange 610. It can be appreciated that the dimensions of ring lip edges 634 of ring lip 632 may correspond to the dimensions of the flange 610. In some aspects, flange 610 may be secured by ring lip edges 634 when the flange 610 is positioned within ring lip 632. For example, movement of flange 610 may be reduced and/or prevented relative to the gripping ring 606 by the ring lip edges 634 when the flange 610 is positioned within ring lip 632. According to some aspects, the gripping ring 606 may define an opening 638 shaped to receive the flange 610. For example, the opening 638 may have a shape and/or size corresponding to a shape and/or size of the flange 610 such that gripping ring 606 may receive the flange 610 through opening 638 upon lowering of gripping ring 606 (along with base 602).

According to some embodiments, base 602 may include recess 626. Recess 626 may be configured to receive and accommodate an upper portion of flange 610 when the flange 610 is received through the opening 638. In one example, this may help create sufficient clearance to allow for ring lip 632 be lowered underneath a lower portion of flange 610 such that the gripping ring 606 is free to rotate relative to flange 610.

It can be appreciated that gripping ring 606, and the above-noted components, may be manufactured as one piece from a blank (e.g. a metal blank) that may be stamped or otherwise constructed into the shape of gripping ring 606. According to some embodiments, gripping ring 606 may also be manufactured from more than one piece (e.g., through various welding processes). According to some embodiments, the shape and/or size of ring lip 632 may correspond to the shape and/or size of the flange 610. In some embodiments, as shown in FIG. 6C, an orientation of the opening 638 is offset by 45 degrees relative to an orientation of the ring lip 632. In some embodiments, the orientation of the opening 638 may be offset by an angle other than 45 degrees (e.g., an angle ranging from 0 and 45) relative to an orientation of the ring lip 632.

FIG. 6C shows cross section 614 of handling device 600 along line AA in FIG. 6A. According to some embodiments, handling device 600 may include an alignment sensor 640 that may be configured to detect presence of pod 608 in station 612. Alignment sensor 640 may be integrated within base 602 and/or placed within the vicinity thereof to detect the presence of and/or alignment status of pod 608. In some embodiments, the alignment sensor 640 may be configured to detect an alignment status of gripping ring 606 relative to flange 610. The alignment status of gripping ring 606 relative to flange 610 may indicate a position of gripping ring 606 relative to a position of flange 610. For example, the alignment sensor 640 may be configured to detect an alignment status of opening 638 of the gripping ring 606 and the flange 610. Additionally and/or alternatively, the alignment sensor 640 may be configured to detect an alignment status of the ring lip 632 and the flange 610. According to some embodiments, alignment sensor 640 may detect markings on flange 610 (e.g., QR code markings, alignment markings, etc.) to determine the alignment of flange 610, and by extension, pod 508. According to some embodiments, a processor (e.g., controller 310) may be configured to determine the presence of pod 608 and thus trigger a transport protocol that includes the lowering, rotating, and lifting operations described herein based on signals received from the alignment sensor 610.

According to some embodiments, FIG. 6C illustrates a view from which gripping ring 606 may be aligned with flange 610. For example, as shown in FIG. 6C, in an aligned orientation, edges of flange 610 may be aligned with corresponding edges of opening 638. Although not necessarily visible from this view, FIG. 6C also shows the location of ring lip 632, which may receive flange 610 after gripping ring 606 is lowered, rotated to a position in which the ring lip 632 and/or ring lip edges 634 are aligned with the flange 610, and raised such that the flange 610 engages the ring lip 632. It can be understood that ring lip 632 may not be visible from this view.

FIG. 6D shows cross section 616 of handling device 600 along line BB in FIG. 6A. According to some embodiments, cross section 616 shows base 602, lift belt(s) 604, pod 608, flange 610, gripping ring 606, and opening 638. As can be seen from cross section 616, opening 638 may have dimensions that closely conform to the dimensions of flange 610. This close conformity to the dimensions allows for flange 610 to go through (e.g., be received by) opening 638 of gripping ring 606, when gripping ring 606 is lowered over the flange 610.

FIGS. 7-9 illustrate operations of a handling system 700 according to exemplary embodiments. For example, FIGS. 7A-7C illustrate an alignment operation from which a gripping ring 706 is lowered onto a pod 708. According to some embodiments, FIG. 7A illustrates a lowering operation of gripping ring 706 by lift belt(s) 704. In some aspects, an initial alignment may be necessary to determine the alignment of the pod 708. For example, as discussed with reference to FIG. 6C, if a processor (e.g., controller 310) determines pod 708 is not aligned based on signals received from an alignment sensor 740 handling system 700 can provide an appropriate response. One such response may be to alert an operator to properly align pod 708. Additionally, or in the alternative, station 712 may be equipped with a rotating device configured to rotate the pod 708 to a desired orientation.

FIG. 7B shows a cross section 714 of handling system 700 along line AA in FIG. 7A, according to some embodiments. According to some embodiments, cross section 712 shows base 702, gripping ring 706, flange 710, ring lip 732, opening 738, and alignment sensor 740. As described herein, alignment sensor 740 may be configured to determine the alignment status of flange 710 (e.g. relative to gripping ring 706) by detecting markings on flange 710. For example, flange 710 may include markings, such as QR markings, or the like, that can be detected by alignment sensor 740. In response to detecting the markings, a processor (e.g., controller 310) may be configured to determine an identification of pod 708. The identification of pod 708 may include information such as an orientation of flange 710 and/or other information relating to pod 708. For example, such information may include pod content (e.g., load information) for tracking purposes. The identification of the pod 708 may also include identification of a load port (e.g., port 512). In some embodiments, a processor (e.g., controller 310) may be configured to instruct moving apparatus 704 to move pod 708 to a load port (e.g., port 512) in response to determining the identification of pod 708.

In some embodiments, opening 738 may be configured to allow flange 710 to be received by gripping ring 706. The term receive in this context may indicate gripping ring 706 is sufficiently lowered where the lowest portion of flange 710 is above the highest portion of ring lip 732.

The lowered position of the components of handling system 700 may be further illustrated in FIG. 7C. According to some embodiments, FIG. 7C shows cross section 716 of handling system 700 along line BB in FIG. 7A. According to some embodiments, gripping ring 706 may be lowered to a level where the highest portion of ring lip 732 is at a lower vertical position than the lowest portion of flange 710. This configuration may be enabled when gripping ring 706 is lowered onto flange 710, and flange 710 is received through opening 738.

According to some embodiments, to further control the upward and downward movement of gripping ring 706 (along with base 702), handling system 700 may be further equipped with a proximity sensor 742. According to some aspects, proximity sensor 742 may be a sensor able to detect the presence of nearby objects with or without physical contact. According to some embodiments, proximity sensor 742 may emit an electromagnetic field or beam of electromagnetic radiation and monitor changes in the field of return signal. For example, proximity sensor 742 may emit infrared light or the like. Proximity sensor 742 may also be a capacitive sensor, a photoelectric sensor, an inductive sensor, or the like. According to some embodiments, it can be appreciated that proximity sensor 742 may also include alignment sensor 740 to reduce system complexities, weight, and cost.

According to some embodiments, proximity sensor 742 may be configured to perform one or more functions relating to determining distances between gripping ring 706 and flange 710. In this regard, according to some embodiments, proximity sensor 742 may be configured to detect a distance between gripping ring 706 and flange 710. According to some embodiments, proximity sensor 742 may be configured to detect contact between gripping ring 706 and flange 710. In this regard, proximity sensor 742 may convey to a processor (e.g., controller 310) that gripping ring 706 is not in contact with flange 710. In some embodiments, a processor (e.g., controller 310) may be configured to determine whether the distance between gripping ring 706 and flange 710 is sufficient to allow rotation of the gripping ring 706 relative to the flange 710 (e.g., a threshold distance) based on signals received from the proximity sensor 742. For example, the base 702 may configured to rotate the gripping ring 706 in response to a determination that the distance between gripping ring 706 and flange 710 is a threshold distance. In other embodiments, the processor (e.g., controller 310) may be configured to determine whether the distance between the proximity sensor 742 and/or base 702 and the gripping ring 706 is sufficient to allow rotation of the gripping ring 706 relative to the flange 710 based on signals received from the proximity sensor 742. According to some embodiments, the dimensions of the components (e.g., the flange 710, the pod 708, the gripping ring 706, the base 702, or the like) may be known to proximity sensor 742 and/or controller 310. Accordingly, when, for example, proximity sensor 742 detects that gripping ring 706 is within a predetermined distance from flange 710, proximity sensor 742 and/or controller 310 may be configured to calculate the threshold range based on the dimensions known by the proximity sensor 742 and/or controller 310. This determination may enable a subsequent rotation of gripping ring 706 to grip and secure flange 710, as will be further discussed with reference to FIGS. 8A-8C.

According to some embodiments, proximity sensor 742 may additionally, or alternatively, be configured to detect proximity/contact between base 702 and a top surface of flange 710. Such measurement may be used to determine when gripping ring 706 may be rotated. According to one example, when proximity sensor 742 senses that base 702 is in contact with, or in near contact with top surface of flange 710, controller 310 may then determine that it is safe to rotate gripping ring 706 to grip and secure flange 710. According to some embodiments, the dimensions of pod 708 may be known to controller 310, since they may be standard dimensions of a pod (e.g., SEMI E152). Moreover, the dimensions of base 702 and gripping ring 706 may also be known to controller 310. Accordingly, upon detecting contact between base 702 and top surface of flange 710, controller 310 may determine that there is sufficient clearance for portions of gripping ring 706 to rotate about (and underneath) flange 710. The rotation of gripping ring 706 is further described in FIGS. 8A-8C below.

FIGS. 8A-8C illustrate a ring rotating operation according to some embodiments. FIG. 8A is an illustration of handling system 800 at a lowered position where gripping ring 806 (and base 802) are lowered by lift belt(s) 804 to perform a pick up operation of pod 808 that is detected within station 812.

FIG. 8B shows cross section 814 of handling system 800 along line AA of FIG. 8A. According to some embodiments, proximity sensor 842 may continuously monitor a lowering operation of gripping ring 806 onto flange 810. When a processor (e.g., controller 310) determines via proximity sensor 842 that gripping ring 806 is lowered such that flange 810 extends through opening 838 to enable gripping ring 806 to receive flange 810 and safely rotate about flange 810, gripping ring 806 may then be rotated one degree of freedom (or a predetermined rotation). Such determination may be triggered by, for example, a proximity sensor 842 detecting contact between base 802 and flange 810. The rotation of the gripping ring 806 enables portions 844 of ring lip 832 to be placed underneath flange 810.

FIG. 8C shows cross section 816 of handling system 800 along line BB of FIG. 8A. According to some embodiments, FIG. 8C shows a rotated gripping ring 806 where portions 844 of ring lip 832 (having features similar to those of ring lip 632 as illustrated in FIG. 6) are located underneath flange 810. This configuration can enable base 802 to lift pod 808 by engaging flange 810 at four separate corners (e.g., portions 844), thereby minimizing risk of dropping the pod 808.

According to some embodiments, base 802 may be configured to rotate gripping ring 806 such that edges of the flange 810 align with edges of the ring lip 832. Rotation of ring 806 may be achieved via a motor housed inside base 802. According to some embodiments, handling system 800 may rotate base 802, and thereby rotate gripping ring 806. According to some aspects, base 802 may be configured to rotate gripping ring 806 by a predetermined amount, e.g., 45° degrees. This may be a preset configuration of one degree of freedom to minimize computational bandwidth. For example, given the universality of dimensions of pod 808, base 802 may be configured, for simplicity sake, to rotate a predetermined amount without requiring further measurements. The base 802 may rotate based on a signal transmitted by the proximity sensor 842. According to some embodiments, base 802 may be configured to rotate gripping ring 806 to any desired angle/orientation.

FIGS. 9A-9C illustrate a lifting operation performed by handling system 900, according to exemplary embodiments. According to some aspects, the configuration of a gripping ring, e.g., gripping ring 906, and the use of a proximity sensor, e.g., proximity sensor 942, assist in confirming that pod 908 is secured to gripping ring 906. This configuration may substantially reduce or eliminate the possibility of dropping the pod 908 during lifting. After rotation of the gripping ring 906, proximity sensor 942 may continue to detect the location of the pod 908. For example, when pod 908 is lifted, it may be lifted in two stages. According to some embodiments, a first stage may include an incremental lift of pod 908 to determine if pod 908 is secure and whether pod 908 remains in a suspended state. According to some embodiments, a second stage may begin in response to controller 310 (FIG. 3) determining that the first stage is complete. In the second stage, pod 908 may be transported to the appropriate port (e.g., port 912) for processing.

The following is a detailed discussion of the lifting stages, according to some embodiments. In some embodiments, proximity sensor may be configured to detect a distance between proximity sensor 942 and flange 910 and/or a distance between gripping ring 906 and flange 910. For example, after flange 910 is received by gripping ring 906 through opening 938, gripping ring 906 may be raised such that portions 944 of ring lip 932 engage flange 910. Before portions 944 engage flange 910, readings from proximity sensor 942 may indicate an increasing distance between proximity sensor 942 and flange 910. This increase in distance between proximity sensor 942 and flange 910 may occur because before the gripping ring 906 lifts the flange 910, the gripping ring 906 may be lowered below the flange 910 such that a threshold distance exists between gripping ring 906 and the flange 910. The threshold distance may be sufficient to enable gripping ring 906 to rotate relative to flange 910. In some embodiments, the gripping ring 906 may be configured to rotate in response to a determination (e.g., by a processor such as controller 310) that the distance between the gripping ring 806 and the flange 910 is at least the threshold.

In response to the gripping ring 906 lifting the pod 908 via the flange 910, proximity sensor 942 may be configured to detect, at a first stage, if a distance between proximity sensor 942 and flange 910 distance is less than a predetermined drop distance. If the distance between proximity sensor 942 and flange 910 is determined to be less than the predetermined drop distance a processor (e.g., controller 310) may determine that the first stage of the lift is successful and that pod 908 has not been dropped. Accordingly, the controller 310 may determine that pod 908 may be securely resting within gripping ring 906 (e.g., within ring lip 932 and ring lip edges 934) based on a signal received from the proximity sensor 942. In response to a determination that the distance between proximity sensor 942 and flange 910 is less than the predetermined drop distance, the handling system 900 may proceed to a second stage in which the pod 908 is lifted by the gripping ring 906 to a desired position and/or height (e.g., a position sufficient to remove the pod 908 from a load port or the like), and/or transported to a load port (e.g., load port 912).

If the distance between proximity sensor 942 and flange 910 is determined to be greater than the predetermined drop distance, a processor (e.g., controller 310) may determine that pod 908 is dropped and/or that pod 908 was not properly lifted. The division of the lift operation into stages is a security measure configured to ensure that in the unlikely event of a pod drop, potential damage to the pod is minimized In this example, if a pod drop is detected, pod 908 would have dropped a minimal distance that would unlikely cause physical damage. This measure ensures that any potential issues with the pickup/lift of pod 908 are addressed in the first stage.

According to some embodiments, if it is determined that pod 908 was not properly gripped and/or was dropped (e.g. in response to a determination that the distance between proximity sensor 942 and flange 910 is greater than the predetermined drop distance), controller 310 may generate a message (e.g., a warning message indicating that a pod has been dropped) to be transmitted to an operator (e.g., controller 310 may transmit a signal to a remote device such as a server, computer, or mobile device). This message may be a page, an announcement, an alarm, or some type of indication or a screen message on operator's computing device, for example. Controller 310 may also stop the lifting operation from continuing in response to a determination that the pod 908 was not properly gripped and/or was dropped (e.g., in response to a determination that the distance between proximity sensor 942 and flange 910 is greater than the predetermined drop distance).

According to some embodiments, a security measure is built into the design of the gripping ring 906 itself. While the following example may be provided using the example of gripping ring 606 of FIGS. 6A-6D and gripping ring 706 of FIGS. 7A-7D, it can be understood that the features of gripping ring 606 may be applicable to gripping ring 906. Referring to FIGS. 6A-6D for example, the gripping ring 606 may be lowered over the flange 610 in response to a determination by a processor (e.g., the controller 310) that the flange 610 is aligned with the opening 638 based on a signal received form the alignment sensor 640. The gripping ring 606 may receive flange 610 though opening 638 such that a lower surface of the flange 610 is located above an upper surface of the ring wall 630. In response to a determination that the distance between the gripping ring 606 and the flange 610 is at least the threshold distance based on a signal received from the proximity sensor 642, the gripping ring 606 is rotated such that flange 610 is aligned with ring lip 632. In response to rotation of the griping ring 606, the gripping ring 606 may be moved such that flange 610 is received in ring lip 632 and/or flange 610 is secured by ring lip edges 634. In this configuration (shown in FIGS. 9A-9C), the flange 910 is secured about the portions 944. As such, upon commencement of a lift operation, pod 908 and flange 910 are secure from movement relative to gripping ring 906. This configuration can minimize the risk dropping of the pod 908 during transport.

Although not illustrated herein, it can be appreciated that a handling system 900 may perform an unloading operation in the same, reverse fashion. For example, if the pod 908 is to be unloaded onto a load port (e.g., port 512) for example, to be picked up by an operator, handling system 900 may commence a lowering operation. For example, the handling system 900 may begin to place the pod 908 onto a load port 912. Proximity sensor 942 may detect the distance between the proximity sensor 942 and flange 910 over a period of time. According to some aspects, if a processor (e.g., controller 310) determines that the distance between the proximity sensor 942 and the flange 910 is decreasing, it may be determined that pod 908 is beginning to rest on a surface of station/port 912. According to some embodiments, proximity sensor 942 may detect that the distance between the proximity sensor 942 and flange 910 reaches a proximity threshold. The proximity threshold is a distance between the proximity sensor 942 and the flange 910 sufficient to allow rotation of the gripping ring 906 relative to the flange 910. In response to a determination that the distance between the proximity sensor 942 and flange 910 has reached the proximity threshold, the gripping ring 906 may be rotated relative to the flange 910 such that the opening 938 of the gripping ring 906 is aligned with the flange 910. In response to rotation of the gripping ring 906, the gripping ring 906 may be lifted such that the flange 910 is removed from the gripping ring 910 and the pod 908 is received by the load port 912.

According to some embodiments, a determination of a processor (e.g., the controller 310) to stop the lowering of gripping ring 906 during the lowering operation may depend on whether the handling system 900 requires pod 908 to be rotated before release or not. For example, it may be desirable to have pod 908 rotated to a new orientation suitable for the lithographic apparatus to access the pod 908 for processing. This may be a different orientation than the initial orientation of pod 908 at pick up. In some embodiments, the gripping ring 906 may rotate the flange 910 (and therefore the pod 908) to a desired orientation before the pod 908 is placed on the load port 912 (e.g., before the determination that the distance between the proximity sensor 942 and flange 910 has reached the proximity threshold).

According to some embodiments, alignment sensor 940 may detect an alignment status of pod 908 at drop off and transmit a registry signal to controller 310 noting that the pod has been dropped off. Controller 310 may track a a location of one or more pods (e.g., which pod 908 is currently in load port 912) based on the detected alignment status of one or more pods. Controller 310 may determine which pods are ready for processing by the lithographic apparatus based on the detected alignment status of one or more pods. Controller 310 may determine that a pod (e.g., pod 912) within a load station is ready to be transported to the a loading port (e.g., load port 912), or otherwise ready to be picked up post processing, based on the detected alignment status of the pod. The controller 310 may determine how many reticles are ready for processing based on the detected alignment status of one or more pods.

According to some embodiments, an implementation of a handling system incorporating a gripping ring minimizes failure due to finger disengagement and/or servo motor failure and reduces system complexity. For example, the handling systems described herein may reduce the risk of pod drop and/or damage by determining lift status of the pod at a first stage of the lift. In some aspects, the gripping rings described herein can prevent pod drop if the handling system loses power and/or if one or more motors (e.g., servo motors) fail. The gripping rings described herein may also reduce the need for safety catches connected to a pod because once a flange of a pod is secured within a gripping ring as described above, risk of pod drop is minimized According to some embodiments, use of a proximity sensor as described herein can provide an early indication of a successful pod lift and/or lift issues (e.g., pod not secure, pod drop). The handling systems described herein also minimize pod damage event of pod drop.

According to some embodiments, the implementation of a gripping ring also provides for rotation functionality. This can allow (a) the gripping ring to rotate underneath the pod for lifting, and (b) pod rotation when necessary. This rotation may be pre-configured to be a set rotation of one degree of freedom for example, therefore reducing the need for hardware, controls, and costs of associated electronics of servo motors and fingers. According to some embodiments, side forces on the flange and by extension on the pod may be minimized by securing the flange within a ring lip as described above. According to some embodiments, the implementation of the described gripping rings may also eliminate challenges of synchronizing multiple gripping fingers, and reduce the complexity of hardware and control systems.

Figure 10:
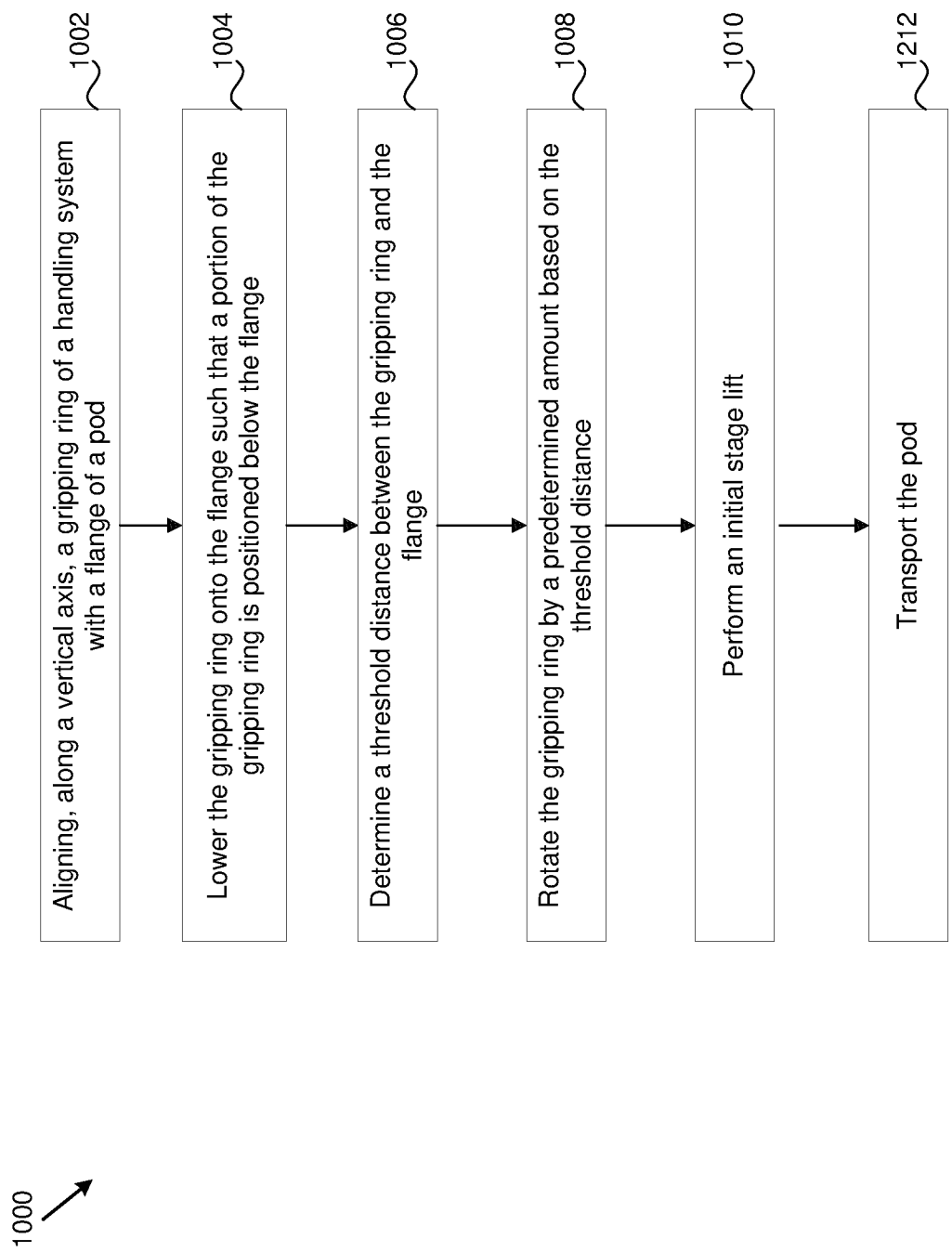
FIG. 10 illustrates a flow diagram showing an example of a transport method, according to some embodiments.

FIG. 10 illustrates a method 1000 for transporting a pod, e.g., pod 608, according to some embodiments. For example, method 1000 may be performed by the embodiments shown in FIGS. 6-9. The operations in method 1000 may not be performed in the order shown, or may include more or less of the operations described in method 1000, according to certain aspects.

According to some aspects, step 1002 may include aligning, along a vertical axis, a gripping ring (e.g., gripping ring 608) of a handling system (e.g., handling system 600) with a flange (e.g., flange 610).

According to some aspects, step 1004 may include lowering of the gripping ring onto the flange, such that a portion of the gripping ring is positioned below the flange.

In some aspects, step 1006 may include determining, using a proximity sensor (e.g., proximity sensor 742), a threshold distance between the gripping ring and the flange. In another aspect, step 1006 may include determining, using the proximity sensor (e.g., proximity sensor 742), a threshold distance between the proximity sensor and/or a base (e.g., base 602) and the flange.

In some aspects, step 1008 may include rotating the gripping ring about a vertical axis by a predetermined amount based on the threshold distance.

In some aspects, step 1010 may include lifting the pod in a first stage. The first stage may include an incremental lift of the flange to determine of the pod is securely engaged within the gripping ring (e.g., gripping ring 906). According to some embodiments, if it is determined that the pod is securely engaged within gripping ring 906, method 1000 may then further include step 1012, in which the pod is transported to the designated load port after the first stage.

Although not illustrated in FIG. 10, it can be appreciated that method 1000 may further include other/additional steps that facilitate the transport of a pod as will be further described herein.

According to some embodiments, method 1000 may further include transporting the pod from a manual loading station to a load port of a lithographic processing apparatus, the manual loading station being a location where an operator initially loads the pod.

According to some aspects, method 1000 may also include detecting, by an optical sensor, a marking on the flange. According to some aspects, the marking may be a quick response (QR) code indicative of an orientation and identification of the pod. According to some embodiments, method 1000 may further include transmitting, to a processor (e.g., controller 310), a signal indicative of an orientation status of the pod in response to the detection of the marking In one aspect, the signal may be a warning signal in response to the detection of the marking indicating a misalignment.

According to some embodiments, the lowering and lifting operations may be performed by a hoist.

The embodiments may further be described using the following clauses:

1. A system comprising,
   a moving apparatus comprising:
      a base coupled to the moving apparatus; and
      a gripping ring extending from the base, wherein the gripping ring is configured to grip a flange extending from a pod, and
      wherein the moving apparatus is configured to move the base in response to the gripping ring gripping the flange.

2. The system of clause 1, wherein the gripping ring comprises a ring wall and a ring lip.

3. The system of clause 2, wherein the ring wall comprises a mounting assembly configured to connect the gripping ring to the base.

4. The system of clause 2, wherein the ring lip is a recess defined by the ring wall.

5. The system of clause 1, wherein the gripping ring defines an opening having a shape corresponding to the shape of the flange.

6. The system of clause 1, comprising:
   an alignment sensor configured to detect an alignment status of the gripping ring relative to the flange.

7. The system of clause 6, wherein the alignment sensor is configured to detect the alignment status by detecting a marking on the flange.

8. The system of clause 7, wherein the marking is a quick response (QR) code marking.

9. The system of clause 8, wherein the alignment sensor is configured to relay the QR code to a processor.

10. The system of clause 8, wherein
    the moving apparatus comprises a processor, and the processor is configured to determine an identification of the pod in response to the alignment sensor detecting the QR code.

11. The system of clause 10, wherein the identification of the pod comprises load information of the pod.

12. The system of clause 10, wherein
the identification of the pod comprises identification of a load port, and
the processor is configured to instruct the moving apparatus to move the pod to the load port in response to determining the identification of the pod.

13. The system of clause 1, comprising:
a proximity sensor configured to detect a distance between the gripping ring and the flange.

14. The system of clause 13, wherein the base is configured to rotate the gripping ring in response to a determination that the distance between the gripping ring and the flange is a threshold distance.

15. The system of clause 1, wherein the base is configured to rotate the gripping ring to a position in which edges of the flange align with ring lip edges of the ring lip.

16. The system of clause 1, wherein the moving apparatus is configured to move the base according to:
a first stage in which the moving apparatus is configured to incrementally move the base and in which a proximity sensor is configured to detect a distance between the proximity sensor and the flange; and
a second stage in which the moving apparatus is configured to move the base to a load port in response to a determination that the distance between the proximity sensor and the flange is less than a predetermined drop distance.

17. The system of clause 1 comprising a processor, wherein the moving apparatus is configured to move the base according to:
a first stage in which the moving apparatus is configured to incrementally move the base and in which a proximity sensor is configured to detect a distance between the proximity sensor and the flange; and
a second stage in which the moving apparatus is configured to stop movement of the base and in which the processor is configured to transmit a signal indicating that the pod has been dropped in response to a determination that the distance between the proximity sensor and the flange is greater than a predetermined drop distance.

18. The system of clause 2, wherein an interior profile of the ring lip corresponds to an exterior profile of the flange.

19. The system of clause 2, wherein
the gripping ring defines an opening shaped to receive the flange, and
an orientation of the opening is offset by 45 degrees relative to an orientation of the ring lip.

20. A lithographic apparatus comprising:
a moving apparatus;
a base coupled to the moving apparatus; and
a gripping ring extending from the base, the gripping ring being configured to grip a flange extending from a pod;
wherein the moving apparatus is configured to move the base in response to the gripping ring gripping the flange.

21. A gripping ring configured to grip a flange of a pod, the gripping ring comprising:
a ring wall defining an opening, wherein the opening has a shape corresponding to a shape of the flange; and
a ring lip, wherein the ring lip is a recess defined by the ring wall, and wherein an interior profile of the ring lip corresponds with an exterior profile of the flange.

Although specific reference can be made in this text to the use of lithographic apparatus in the manufacture of ICs, it should be understood that the lithographic apparatuses described herein can have other applications, such as the manufacture of integrated optical systems, guidance and detection patterns for magnetic domain memories, flat-panel displays, LCDs, thin-film magnetic heads, etc. The skilled artisan will appreciate that, in the context of such alternative applications, any use of the terms "wafer" or "die" herein can be considered as synonymous with the more general terms "substrate" or "target portion", respectively. The substrate referred to herein can be processed, before or after exposure, in for example a track unit (a tool that typically applies a layer of resist to a substrate and develops the exposed resist), a metrology unit, and/or an inspection unit. Where applicable, the disclosure herein can be applied to such and other substrate processing tools. Further, the substrate can be processed more than once, for example in order to create a multi-layer IC, so that the term substrate used herein can also refer to a substrate that already contains multiple processed layers.

It is to be understood that the phraseology or terminology herein is for the purpose of description and not of limitation, such that the terminology or phraseology of the present specification is to be interpreted by those skilled in relevant art(s) in light of the teachings herein.

The examples disclosed herein are illustrative, but not limiting, of the embodiments of this disclosure. Other suitable modifications and adaptations of the variety of conditions and parameters normally encountered in the field, and which would be apparent to those skilled in the relevant art(s), are within the spirit and scope of the disclosure.

While specific aspects of the disclosure have been described above, it will be appreciated that the aspects can be practiced otherwise than as described. The description is not intended to limit the embodiments of the disclosure.

It is to be appreciated that the Detailed Description section, and not the Background, Summary, and Abstract sections, is intended to be used to interpret the claims. The Summary and Abstract sections may set forth one or more but not all example embodiments as contemplated by the inventor(s), and thus, are not intended to limit the present embodiments and the appended claims in any way.

Some aspects of the disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific aspects of the disclosure will so fully reveal the general nature of the aspects that others can, by applying knowledge within the skill of the art, readily modify and/or adapt for various applications such specific aspects, without undue experimentation, without departing from the general concept of the present disclosure. Therefore, such adaptations and modifications are intended to be within the meaning and range of equivalents of the disclosed aspects, based on the teaching and guidance presented herein.

The breadth and scope of the present disclosure should not be limited by any of the above-described example aspects or embodiments, but should be defined only in accordance with the following claims and their equivalents.

The invention claimed is:

1. A system comprising,
a moving apparatus comprising:
   a base coupled to the moving apparatus; and
   a gripping ring extending from the base, wherein the gripping ring is configured to grip a flange extending from a pod, and
   wherein the moving apparatus is configured to move the base in response to the gripping ring gripping the flange and according to:
      a first stage in which the moving apparatus is configured to incrementally move the base and in which a proximity sensor is configured to detect a distance between the proximity sensor and the flange; and
      a second stage in which the moving apparatus is configured to:
         move the base to a load port in response to a determination that the distance between the proximity sensor and the flange is less than a predetermined drop distance, or
         stop movement of the base and in which a processor is configured to transmit a signal indicating that the pod has been dropped in response to a determination that the distance between the proximity sensor and the flange is greater than a predetermined drop distance.

2. The system of claim 1, wherein:
the gripping ring comprises a ring wall and a ring lip;
the ring wall comprises a mounting assembly configured to connect the gripping ring to the base; and
the ring lip is a recess defined by the ring wall.

3. The system of claim 2, wherein:
the gripping ring defines an opening shaped to receive the flange;
an orientation of the opening is offset by 45 degrees relative to an orientation of the ring lip; and/or
an interior profile of the ring lip corresponds to an exterior profile of the flange.

4. The system of claim 1, wherein:
the gripping ring defines an opening having a shape corresponding to the shape of the flange; and/or
the base is configured to rotate the gripping ring to a position in which edges of the flange align with ring lip edges of the ring lip.

5. The system of claim 1, comprising:
an alignment sensor configured to detect an alignment status of the gripping ring relative to the flange.

6. The system of claim 5, wherein the alignment sensor is configured to detect the alignment status by detecting a marking on the flange.

7. The system of claim 6, wherein the marking is a quick response (QR) code marking.

8. The system of claim 7, wherein:
the moving apparatus comprises a processor;
the processor is configured to determine an identification of the pod in response to the alignment sensor detecting the QR code; and/or
the alignment sensor is configured to relay the QR code to the processor.

9. The system of claim 8, wherein the identification of the pod comprises load information of the pod.

10. The system of claim 8, wherein:
the identification of the pod comprises identification of the load port; and the processor is configured to instruct the moving apparatus to move the pod to the load port in response to determining the identification of the pod.

11. The system of claim 1, comprising:
a proximity sensor configured to detect a distance between the gripping ring and the flange, wherein the base is configured to rotate the gripping ring in response to a determination that the distance between the gripping ring and the flange is a threshold distance.

12. A system comprising,
a moving apparatus comprising:
   a base coupled to the moving apparatus; and
   a gripping ring extending from the base, wherein the gripping ring is configured to grip a flange extending from a pod, and
   wherein the moving apparatus is configured to move the base in response to the gripping ring gripping the flange and to move the base according to:
      a first stage in which the moving apparatus is configured to incrementally move the base and in which a proximity sensor is configured to detect a distance between the proximity sensor and the flange; and
      a second stage in which the moving apparatus is configured to move the base to a load port in response to a determination that the distance between the proximity sensor and the flange is less than a predetermined drop distance.

13. A system comprising,
a moving apparatus comprising:
   a base coupled to the moving apparatus; and
   a gripping ring extending from the base, wherein the gripping ring is configured to grip a flange extending from a pod, and
   wherein the moving apparatus is configured to move the base in response to the gripping ring gripping the flange to move the base according to:
      a first stage in which the moving apparatus is configured to incrementally move the base and in which a proximity sensor is configured to detect a distance between the proximity sensor and the flange; and
      a second stage in which the moving apparatus is configured to stop movement of the base and in which a processor is configured to transmit a signal indicating that the pod has been dropped in response to a determination that the distance between the proximity sensor and the flange is greater than a predetermined drop distance.

14. A lithographic apparatus comprising:
a moving apparatus;
a base coupled to the moving apparatus; and
a gripping ring extending from the base, the gripping ring being configured to grip a flange extending from a pod;
wherein the moving apparatus is configured to move the base in response to the gripping ring gripping the flange, and according to:
   a first stage in which the moving apparatus is configured to incrementally move the base and in which a proximity sensor is configured to detect a distance between the proximity sensor and the flange; and
   a second stage in which the moving apparatus is configured to:
      move the base to a load port in response to a determination that the distance between the proximity sensor and the flange is less than a predetermined drop distance, or stop movement of the base and in which a processor is configured to transmit a signal indicating that the pod has been dropped in response to a determination that the distance between the proximity sensor and the flange is greater than a predetermined drop distance.

* * * * *

UNITED STATES PATENT AND TRADEMARK OFFICE
CERTIFICATE OF CORRECTION

| | | |
|---|---|---|
| PATENT NO. | : 12,474,633 B2 | Page 1 of 1 |
| APPLICATION NO. | : 18/023985 | |
| DATED | : November 18, 2025 | |
| INVENTOR(S) | : Kogan et al. | |

It is certified that error appears in the above-identified patent and that said Letters Patent is hereby corrected as shown below:

On the Title Page

Item (57), under "ABSTRACT", Line 4, delete "abase" and insert -- a base --, therefor.

Signed and Sealed this
Twenty-third Day of December, 2025

John A. Squires
*Director of the United States Patent and Trademark Office*